United States Patent
Li et al.

(10) Patent No.: US 8,637,941 B2
(45) Date of Patent: Jan. 28, 2014

(54) SELF-ALIGNED CONTACT EMPLOYING A DIELECTRIC METAL OXIDE SPACER

(75) Inventors: Ying Li, Newburgh, NY (US); Henry K. Utomo, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 12/943,995

(22) Filed: Nov. 11, 2010

(65) Prior Publication Data

US 2012/0119307 A1    May 17, 2012

(51) Int. Cl.
*H01L 29/72* (2006.01)

(52) U.S. Cl.
USPC .............. 257/410; 257/384; 257/E21.159; 257/E29.242

(58) Field of Classification Search
USPC .............. 257/384, 410, E21.159, E29.242
See application file for complete search history.

(56) References Cited

U.S. PATENT DOCUMENTS

| | | | | |
|---|---|---|---|---|
| 5,162,884 A | * | 11/1992 | Liou et al. | 257/384 |
| 2005/0124125 A1 | * | 6/2005 | Jin et al. | 438/301 |

* cited by examiner

*Primary Examiner* — Edward Wojciechowicz
(74) *Attorney, Agent, or Firm* — Scully, Scott, Murphy & Presser, P.C.; Yuanmin Cai

(57) ABSTRACT

A dielectric liner is formed on sidewalls of a gate stack and a lower contact-level dielectric material layer is deposited on the dielectric liner and planarized. The dielectric liner is recessed relative to the top surface of the lower contact-level dielectric material layer and the top surface of the gate stack. A dielectric metal oxide layer is deposited and planarized to form a dielectric metal oxide spacer that surrounds an upper portion of the gate stack. The dielectric metal oxide layer has a top surface that is coplanar with a top surface of the planarized lower contact-level dielectric material layer. Optionally, the conductive material in the gate stack may be replaced. After deposition of at least one upper contact-level dielectric material layer, at least one via hole extending to a semiconductor substrate is formed employing the dielectric metal oxide spacer as a self-aligning structure.

12 Claims, 25 Drawing Sheets

SELF-ALIGNED CONTACT EMPLOYING A DIELECTRIC METAL OXIDE SPACER

BACKGROUND

The present disclosure generally relates to semiconductor devices, and particularly to semiconductor structures having a dielectric metal oxide spacer configured to enable a self-aligned contact, and methods of manufacturing the same.

Self-aligned contact structures employ a dielectric spacer around a gate stack, which is sufficiently resistant to etch chemistry employed to form a via hole extending to a surface located below the topmost surface of the gate stack. The material employed for the dielectric spacer has to be different from the dielectric material layer through which the via hole is formed. However, etch chemistries do not provide infinite selectivity. Thus, erosion of some portion of the dielectric spacer is inevitable if any surface of the dielectric spacer is exposed during the formation of the via hole in the dielectric material layer.

A successful implementation of a self-aligned contact scheme depends on providing sufficient selectivity in the etch process employed to etch the dielectric material layer relative to the material of the dielectric spacer. Typically, doped or undoped silicate glass or organosilicate glass is employed for the dielectric material layer, and silicon nitride is employed for the dielectric spacer. The selectivity of the currently available etch processes is not sufficient to maintain the undesirable etching to the dielectric spacer at an insignificant level. An excessive erosion of the dielectric spacer during formation of a self-aligned via hole can expose a conductive material within a gate stack to cause a direct electrical short, or can form a thin region in the eroded dielectric spacer that provides a leakage current path between a conductive material within a gate stack and a contact via through the thin region. Thus, without a reliable process that minimizes thinning of the dielectric spacer during a self-aligned via hole etch, a self-aligned contact scheme is prone to manufacturing a high percentage of defective devices that do not function or does not meet the specification from the beginning or unreliable devices that fail in time after some usage.

BRIEF SUMMARY

A dielectric liner is formed on sidewalls of a gate stack and a lower contact-level dielectric material layer is deposited on the dielectric liner and planarized. The dielectric liner is recessed relative to the top surface of the lower contact-level dielectric material layer and the top surface of the gate stack. A dielectric metal oxide layer is deposited and planarized to form a dielectric metal oxide spacer that surrounds an upper portion of the gate stack. The dielectric metal oxide layer has a top surface that is coplanar with a top surface of the planarized lower contact-level dielectric material layer. Optionally, the conductive material in the gate stack may be replaced. At least one upper contact-level dielectric material layer is deposited over the lower contact-level dielectric material layer and the dielectric metal oxide spacer, and at least one via hole extending from the topmost surface of the at least one upper contact-level dielectric material layer to a semiconductor substrate is formed employing the dielectric metal oxide spacer as a self-aligning structure.

According to an aspect of the present disclosure, a semiconductor structure includes: a gate dielectric located on a semiconductor substrate; a gate electrode structure located on the gate dielectric; and a dielectric metal oxide spacer contacting an upper portion of the gate electrode and not contacting a lower portion of the gate electrode.

According to another aspect of the present disclosure, a method of forming a semiconductor structure includes: forming a gate stack on a semiconductor substrate; forming a dielectric liner over the gate stack and the semiconductor substrate; forming a dielectric material layer over the dielectric liner and planarizing the dielectric material layer; recessing an upper portion of the dielectric liner and forms a recessed region laterally surrounding an upper portion of the gate stack; and forming a dielectric metal oxide spacer within the recessed region.

BRIEF DESCRIPTION OF THE SEVERAL VIEWS OF THE DRAWINGS

FIG. 1 is a vertical cross-sectional view of the first exemplary semiconductor structure after formation of disposable gate structures according to the first embodiment of the present disclosure.

FIG. 2 is a vertical cross-sectional view of the first exemplary semiconductor structure after formation of inner dielectric spacers and source and drain extension regions.

FIG. 3 is a vertical cross-sectional view of the first exemplary semiconductor structure after formation of outer dielectric spacers, source and drain regions, and metal-semiconductor-alloy regions.

FIG. 4 is a vertical cross-sectional view of the first exemplary semiconductor structure after formation of a dielectric liner.

FIG. 5 is a vertical cross-sectional view of the first exemplary semiconductor structure after deposition of a lower contact-level dielectric material layer and a first planarization.

FIG. 6 is a vertical cross-sectional view of the first exemplary semiconductor structure after recessing upper portions of the dielectric liner.

FIG. 7 is a vertical cross-sectional view of the first exemplary semiconductor structure after deposition of a dielectric metal oxide layer.

FIG. 8 is a vertical cross-sectional view of the first exemplary semiconductor structure after a second planarization and exposure of the top surface of disposable semiconductor material portions.

FIG. 9 is a vertical cross-sectional view of the first exemplary semiconductor structure after removal of the disposable semiconductor material portions.

FIG. 10 is a vertical cross-sectional view of the first exemplary semiconductor structure after deposition of a first work-function-metal layer.

FIG. 11 is a vertical cross-sectional view of the first exemplary semiconductor structure after lithographic patterning of the first work-function-metal layer.

FIG. 12 is a vertical cross-sectional view of the first exemplary semiconductor structure after deposition of a second work-function-metal layer and a conductive material layer.

FIG. 13 is a vertical cross-sectional view of the first exemplary semiconductor structure after planarization of the conductive material layer.

FIG. 14 is a vertical cross-sectional view of the first exemplary semiconductor structure after deposition of at least one upper contact-level dielectric material layer and formation of self-aligned contact via holes.

FIG. 15 is a vertical cross-sectional view of the first exemplary semiconductor structure after formation of self-aligned contact structures.

FIG. 16 is a vertical cross-sectional view of the second exemplary semiconductor structure after formation of gate structures according to the second embodiment of the present disclosure.

FIG. 17 is a vertical cross-sectional view of the second exemplary semiconductor structure after formation of inner dielectric spacers and source and drain extension regions.

FIG. 18 is a vertical cross-sectional view of the second exemplary semiconductor structure after formation of outer dielectric spacers, source and drain regions, and metal-semiconductor-alloy regions.

FIG. 19 is a vertical cross-sectional view of the second exemplary semiconductor structure after formation of a dielectric liner.

FIG. 20 is a vertical cross-sectional view of the second exemplary semiconductor structure after deposition of a lower contact-level dielectric material layer and a first planarization.

FIG. 21 is a vertical cross-sectional view of the second exemplary semiconductor structure after recessing upper portions of the dielectric liner.

FIG. 22 is a vertical cross-sectional view of the second exemplary semiconductor structure after deposition of a dielectric metal oxide layer.

FIG. 23 is a vertical cross-sectional view of the second exemplary semiconductor structure after a second planarization and exposure of the top surface of gate electrodes.

FIG. 24 is a vertical cross-sectional view of the second exemplary semiconductor structure after deposition of at least one upper contact-level dielectric material layer and formation of self-aligned contact via holes.

FIG. 25 is a vertical cross-sectional view of the second exemplary semiconductor structure after formation of self-aligned contact structures.

DETAILED DESCRIPTION

Figure 1:
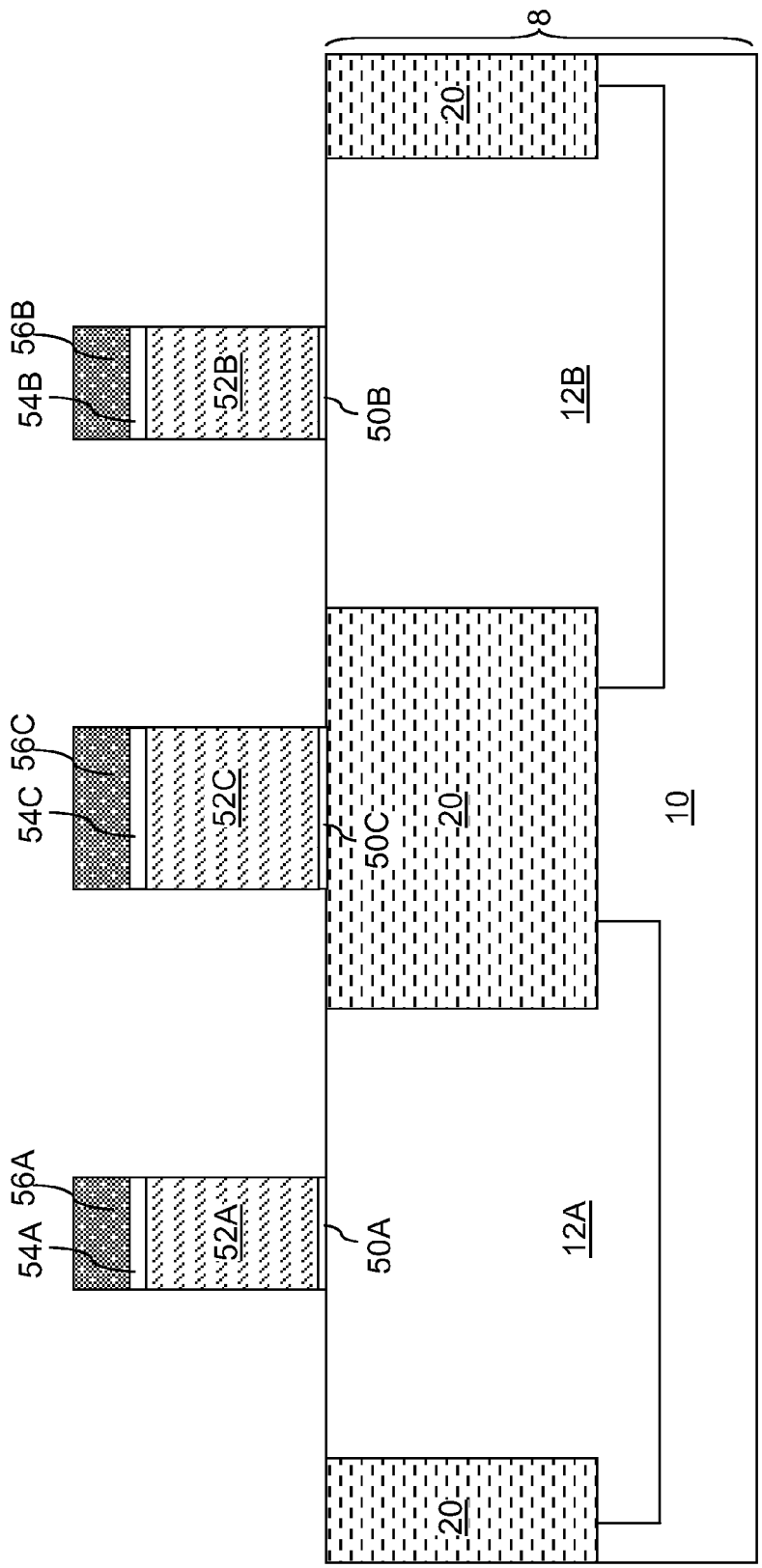
FIGS. 1-15 are sequential vertical cross-sectional view of a first exemplary semiconductor structure according to a first embodiment of the present disclosure.

As stated above, the present disclosure relates to semiconductor structures having a dielectric metal oxide spacer configured to enable a self-aligned contact, and methods of manufacturing the same, which are now described in detail with accompanying figures. It is noted that like and corresponding elements mentioned herein and illustrated in the drawings are referred to by like reference numerals. It is also noted that proportions of various elements in the accompanying figures are not drawn to scale to enable clear illustration of elements having smaller dimensions relative to other elements having larger dimensions.

Referring to FIG. 1, a first exemplary semiconductor structure according to a first embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer. The semiconductor material of the semiconductor substrate 8 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon.

Various portions of the semiconductor material in the semiconductor substrate 8 can be doped with electrical dopants of p-type or n-type at different dopant concentration levels. For example, the semiconductor substrate 8 may include an underlying semiconductor layer 10, a first conductivity type well 12B, and a second-conductivity type well 12A. The first conductivity type well 12B is doped with electrical dopants of a first conductivity type, which can be p-type or n-type. The second conductivity type well 12A is doped with electrical dopants of a second conductivity type, which is the opposite type of the first conductivity type. For example, if the first conductivity type is p-type, the second conductivity type is n-type, and vice versa.

The dopant concentration of the first conductivity type well 12B and the second conductivity type well 12A can be from $1.0 \times 10^{14}/cm^3$ to $1.0 \times 10^{19}/cm^3$, and typically from $1.0 \times 10^{16}/cm^3$ to $1.0 \times 10^{19}/cm^3$, although lesser and greater concentrations can also be employed. The dopant concentration of the underlying semiconductor layer 10 can be from $1.0 \times 10^{14}/cm^3$ to $1.0 \times 10^{19}/cm^3$, and typically from $1.0 \times 10^{15}/cm^3$ to $1.0 \times 10^{16}/cm^3$, although lesser and greater concentrations can also be employed.

Shallow trench isolation structures 20 are formed to laterally separate each of the first conductivity type well 12B and the second conductivity type well 12A. Typically, each of the first conductivity type well 12B and the second conductivity type well 12A is laterally surrounded by a contiguous portion of the shallow trench isolation structures 20. If the semiconductor substrate 8 is a semiconductor-on-insulator substrate, bottom surfaces of the first conductivity type well 12B and the second conductivity type well 12A may contact a buried insulator layer (not shown), which electrically isolates each of the first conductivity type well 12B and the second conductivity type well 12A from other semiconductor portions of the semiconductor substrate 8 in conjunction with the shallow trench isolation structures 20.

Disposable gate structures are formed on the top surface of the semiconductor substrate 8. For example, the disposable gate structures can be formed, for example, by deposition of a stack, from bottom to top, of a gate dielectric layer, a disposable semiconductor material layer, a lower disposable gate cap dielectric layer, and an upper disposable gate cap dielectric layer. The stack is subsequently lithographically patterned to form multiple patterned stacks, which are "gate stacks," i.e., material stacks located at the gate level at which gate electrodes are subsequently formed.

For example, the gate stacks can include a first disposable gate structure, a second disposable gate structure, and a third disposable gate structure, which are herein referred to as a first gate stack, a second gate stack, and a third gate stack, respectively. The first gate stack can be located on the second conductivity type well 12A, the second gate stack can be located on the first conductivity type well 12B, and the third gate stack can be located on a shallow trench isolation structure 20. The first gate stack includes, from bottom to top, a first gate dielectric 50A, a first disposable semiconductor material portion 52A, a first lower disposable gate cap dielectric portion 54A, and a first upper disposable gate cap dielectric portion 56A. The second gate stack includes, from bottom to top, a second gate dielectric 50B, a second disposable semiconductor material portion 52B, a second lower disposable gate cap dielectric portion 54B, and a second upper disposable gate cap dielectric portion 56B. The third gate stack includes, from bottom to top, a third gate dielectric 50C, a third disposable semiconductor material portion 52C, a third lower disposable gate cap dielectric portion 54C, and a third upper disposable gate cap dielectric portion 56C.

The first, second, and third gate dielectrics (50A, 50B, 50C) include a dielectric material such as a dielectric semiconductor oxide, a dielectric semiconductor nitride, a dielectric metal oxide, or a combination thereof. The dielectric semiconductor oxide can include silicon oxide, silicon oxynitride, or a combination thereof. The dielectric semiconductor nitride can include silicon oxide, silicon oxynitride, or a combination thereof. The dielectric metal oxide can include a material having a dielectric constant greater than 8.0. For example, the dielectric metal oxide can be selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from 0.5 to 3 and each value of y is independently from 0 to 2. The thickness of the first, second, and third gate dielectrics (50A, 50B, 50C) can be from 1 nm to 3 nm, although lesser and greater thicknesses can also be employed.

The first, second, and third disposable semiconductor material portions (52A, 52B, 52C) include a semiconductor material that can be subsequently removed selective to dielectric material. For example, the first, second, and third disposable semiconductor material portions can include silicon, germanium, and/or a compound semiconductor material, and can be amorphous or polycrystalline. The thickness of the first, second, and third disposable semiconductor material portions (52A, 52B, 52C) can be from 50 nm to 300 nm, although lesser and greater thicknesses can also be employed.

The first, second, and third lower disposable gate cap dielectric portions (54A, 54B, 54C) include a first dielectric material, and the first, second, and third upper disposable gate cap dielectric portions (56A, 56B, 56C) include a second dielectric material. The first and second dielectric materials can be selected so that the second dielectric material can be removed selective to the first dielectric material. For example, the first dielectric material can be silicon oxide, and the second dielectric material can be silicon nitride. The first, second, and third lower disposable gate cap dielectric portions (54A, 54B, 54C) are remaining portions of a first planar disposable gate cap dielectric layer, and the first, second, and third upper disposable gate cap dielectric portions (56A, 56B, 56C) are remaining portions of a second planar disposable gate cap dielectric layer. The thickness of the first, second, and third lower disposable gate cap dielectric portions (54A, 54B, 54C) can be from 5 nm to 50 nm, although lesser and greater thicknesses can also be employed. The thickness of the first, second, and third upper disposable gate cap dielectric portions (56A, 56B, 56C) can be from 10 nm to 100 nm, although lesser and greater thicknesses can also be employed.

It is noted that other types of disposable material portions can be employed in lieu of any stack of a disposable semiconductor material portion, a lower disposable gate cap dielectric portion, and an upper disposable gate cap dielectric portion provided that such substitutions are compatible with subsequent processing steps for forming dielectric metal oxide spacers.

Figure 2:
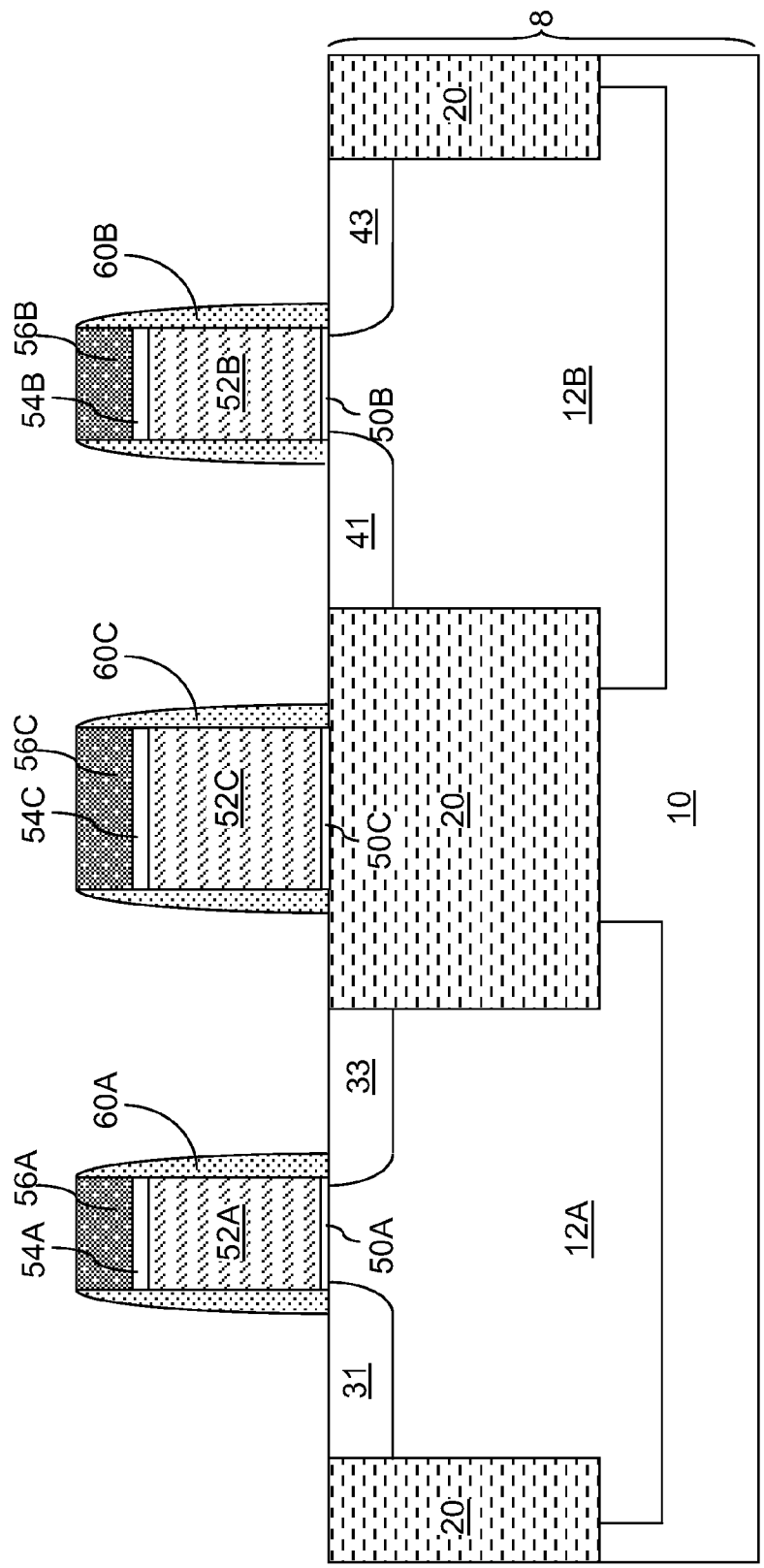

Referring to FIG. 2, source and drain extension regions and inner gate dielectric spacers are formed. The inner gate spacers can be formed, for example, by deposition of a dielectric material layer and an anisotropic etch, or by conversion of surface portions of the semiconductor material in the first, second, and third disposable semiconductor material portions (52A, 52B, 52C) by thermal treatment and/or plasma treatment. A first inner gate spacer 60A can be formed on the sidewalls of the first gate stack (50A, 52A, 54A, 56A), a second inner gate spacer 60B can be formed on the sidewalls of the second gate stack (50B, 52B, 54B, 56B), and a third inner gate spacer 60C can be formed on the sidewalls of the third gate stack (50C, 52C, 54C, 56C). The first, second, and third inner gate spacers (60A, 60B, 60C) include a dielectric material such as silicon oxide, silicon nitride, and/or silicon oxynitride.

Source and drain extension regions are formed by doping upper portions of the first conductivity type well 12B and the second conductivity type well 12A by ion implantation or plasma doping. Formation of the source and drain extension regions can be effected before or after the formation of the various inner gate spacers (60A, 60B, 60C). Various block masks (not shown) can be employed in combination with the various gate stacks and/or the various gate spacers (60A, 60B, 60C) to define regions of the first conductivity type well 12B and the second conductivity type well 12A to be converted into source and drain extension regions. For example, dopants of the first conductivity type can be introduced into upper portions of the second conductivity type well 12A to form a first source extension region 31 and a first drain extension region 33, and dopants of the second conductivity type can be introduced into upper portions of the first conductivity type well 12B to form a second source extension region 41 and a second drain extension region 43. The dopant concentration in the various source and drain extension regions (31, 33, 41, 43) can be from $1.0 \times 10^{18}/cm^3$ to $1.0 \times 10^{21}/cm^3$, and typically from $1.0 \times 10^{19}/cm^3$ to $3.0 \times 10^{20}/cm^3$, although lesser and greater concentrations can also be employed.

Figure 3:
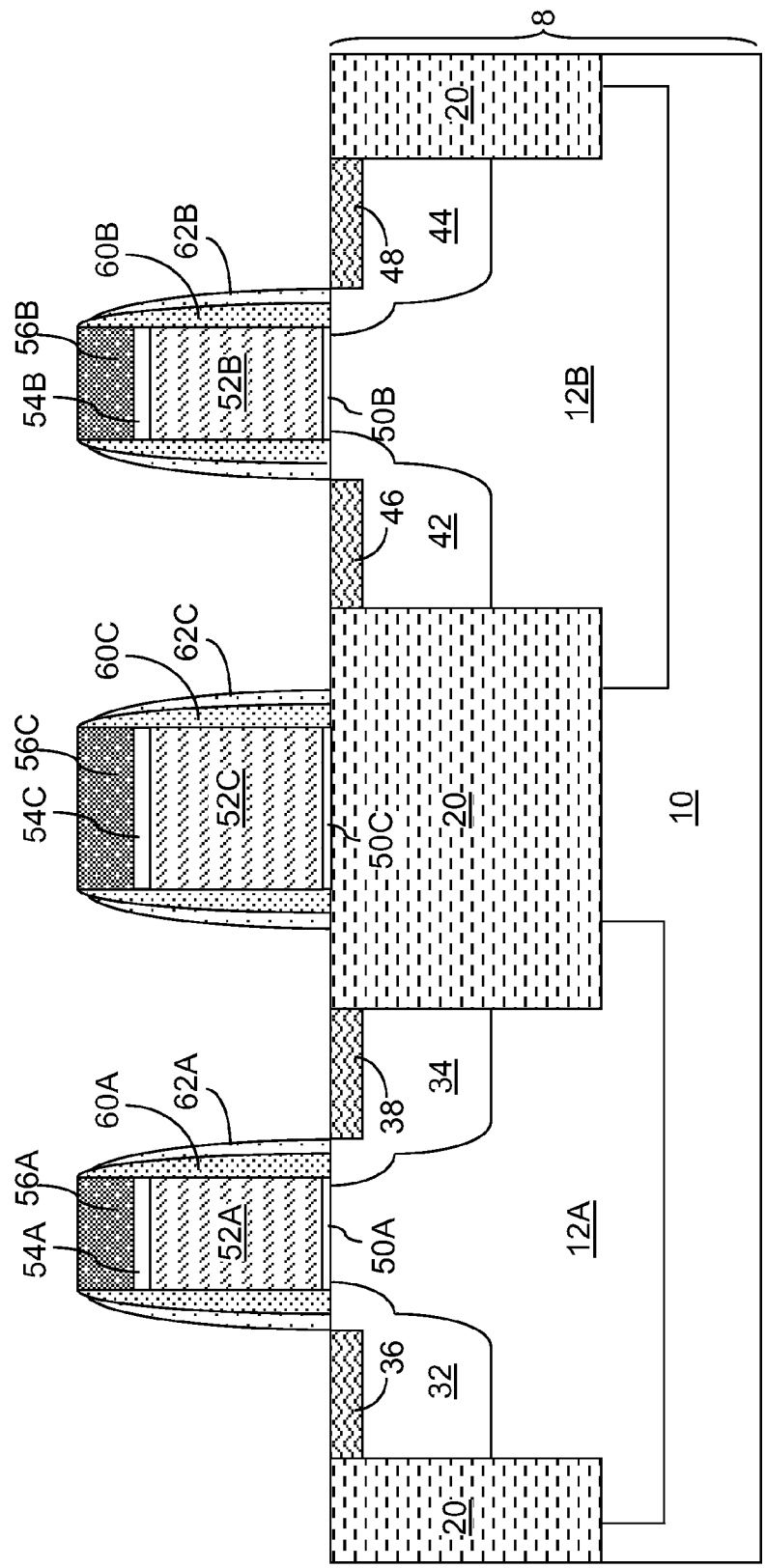

Referring to FIG. 3, outer gate spacers can be formed, for example, by deposition of a dielectric material layer and an anisotropic etch. A first outer gate spacer 62A can be formed on the first inner spacer 60A, a second inner gate spacer 60B can be formed on the second inner spacer 60B, and a third inner gate spacer 60C can be formed on the third inner spacer 60C. The first, second, and third outer gate spacers (62A, 62B, 62C) include a dielectric material such as silicon oxide, silicon nitride, and/or silicon oxynitride.

Source and drain regions are formed by doping upper portions of the first conductivity type well 12B and the second conductivity type well 12A by ion implantation or plasma doping to a depth that exceeds the depths of the various source and drain extension regions (31, 33, 41, 43). The source and drain regions can be formed after the various outer gate spacers (62A, 62B, 62C) are formed. Various block masks (not shown) can be employed in combination with the various gate stacks and/or the various gate spacers (60A, 60B, 60C, 62A, 62B, 62C) to define regions of the first conductivity type well 12B and the second conductivity type well 12A to be converted into source and drain regions. For example, dopants of the first conductivity type can be introduced into upper portions of the second conductivity type well 12A to form a first source region 32 and a first drain region 34, and dopants of the second conductivity type can be introduced into upper portions of the first conductivity type well 12B to form a second source region 42 and a second drain region 44. The first source region 32 merges with, and incorporates, the first source extension region 31, the first drain region 34 merges with, and incorporates, the first drain extension region 33, the second source region 42 merges with, and incorporates, the second source extension region 41, and the second drain region 44 merges with, and incorporates, the second drain extension region 43. The dopant concentration in the various source and drain regions (32, 34, 42, 44) can be from $1.0 \times$ $10^{18}$/cm$^3$ to 3.0×10$^{21}$/cm$^3$, and typically from 1.0×10$^{19}$/cm$^3$ to 5.0×10$^{20}$/cm$^3$, although lesser and greater concentrations can also be employed.

In some embodiments, the first source and drain regions (32, 34) and/or the second source and drain regions (42, 44) can be formed by replacement of the semiconductor material in the second conductivity type well 12A and/or the semiconductor material in the first conductivity type well 12B with a new semiconductor material having a different lattice constant. In this case, the new semiconductor material(s) is/are typically epitaxially aligned with (a) single crystalline semiconductor material(s) of the second conductivity type well 12A and/or the semiconductor material in the first conductivity type well 12B, and apply/applies a compressive stress or a tensile stress to the semiconductor material of the second conductivity type well 12A and/or the semiconductor material in the first conductivity type well 12B in channel portions, i.e., directly below the first gate dielectric 50A and/or the second gate dielectric 50B.

First metal-semiconductor-alloy regions (36, 38) and second metal-semiconductor-alloy regions (46, 48) can be formed on exposed semiconductor portions located on the top surface of the semiconductor substrate 8, i.e., on the first and second source and drain regions (32, 34, 42, 44), for example, by deposition of a metal layer (not shown) and an anneal. Unreacted portions of the metal layer are removed selective to reacted portions of the metal layer. The reacted portions of the metal layer constitute the various metal-semiconductor-alloy regions (36, 38, 46, 48), which can include a metal silicide portions if the semiconductor material of the first and second source and drain regions (36, 38, 46, 48) include silicon. The various inner and outer gate spacers (60A, 62A, 60B, 62B, 60C, 62C) are removed selective to semiconductor materials in the semiconductor substrate 8 and the semiconductor materials in the various gate stacks, for example, by an isotropic etch such as a wet etch. Upper portions of the first, second, and third upper disposable gate cap dielectric portions (56A, 56B, 56C) can be reduced during the removal of the various inner and outer gate spacers (60A, 62A, 60B, 62B, 60C, 62C) due to collateral etching by an etchant.

Figure 4:
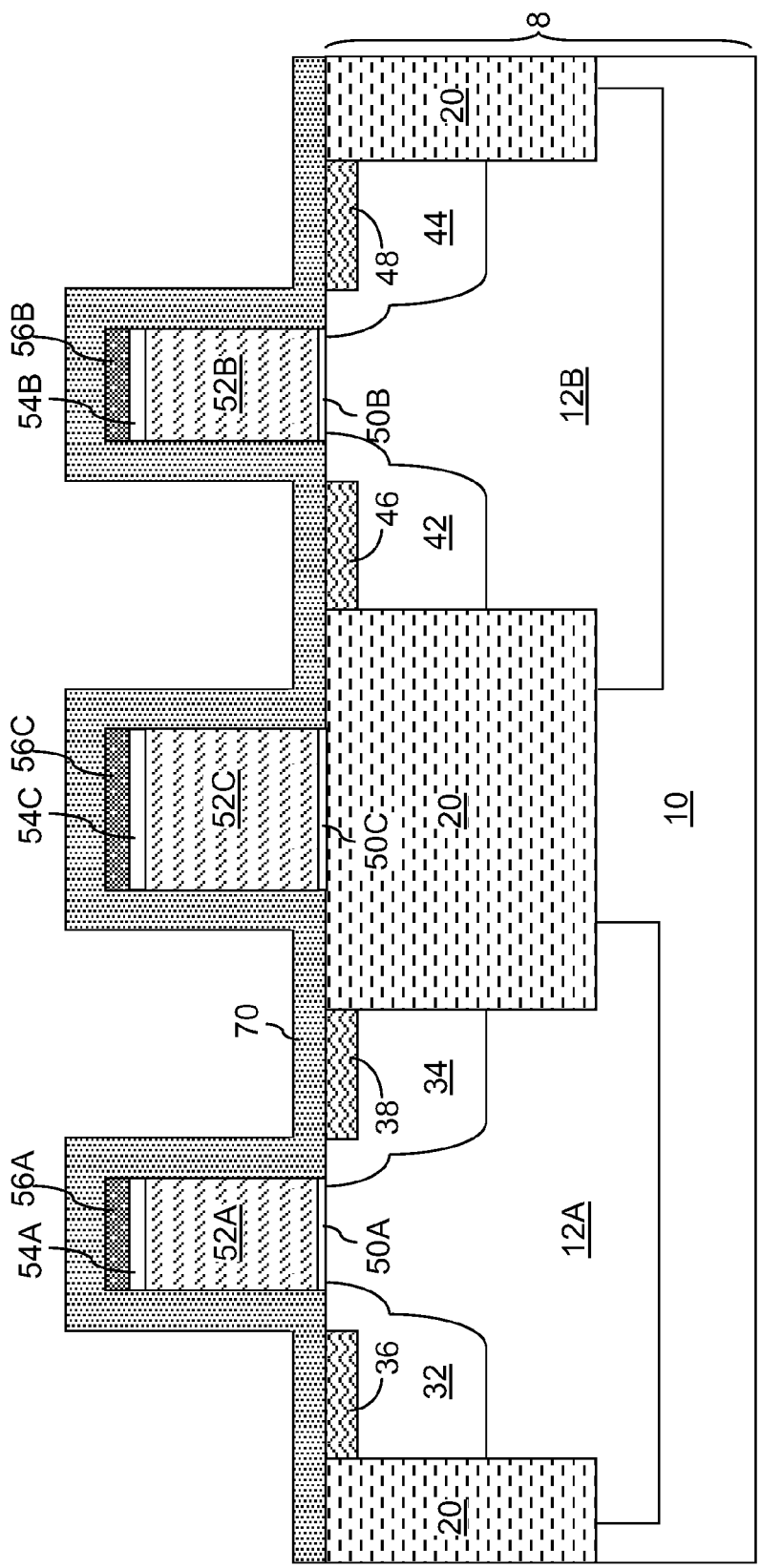

Referring to FIG. 4, a dielectric liner 70 is deposited over the metal-semiconductor-alloy regions (36, 38, 46, 48) and the various gate stacks (50A, 27A, 50B, 27B). The dielectric liner 70 is deposited as a single contiguous layer, which contacts all sidewalls of the first, second, and third gate stacks and all top surfaces of the first, second, and third upper disposable gate cap dielectric portions (56A, 56B, 56C). The dielectric liner 70 can contact exposed surfaces of the first source and drain regions (32, 34) between the first gate stack (50A, 52A, 54A, 56A) and the first source and drain regions (36, 38) and exposed surfaces of the second source and drain regions (42, 44) between the second gate stack (50B, 52B, 54B, 56B) and the second source and drain regions (46, 48).

The dielectric liner 70 includes a dielectric material that is different from the dielectric material of the first, second, and third lower disposable gate cap dielectric portions (56A, 56B, 56C). For example, if the first, second, and third lower disposable gate cap dielectric portions (56A, 56B, 56C) include silicon oxide, the dielectric liner 70 can include silicon nitride, and if the first, second, and third lower disposable gate cap dielectric portions (56A, 56B, 56C) include silicon nitride, the dielectric liner 70 can include silicon oxide. In one embodiment, the dielectric liner 70 can include a same dielectric material as the first, second, and third upper disposable gate cap dielectric portions (56A, 56B, 56C). The dielectric liner 70 can be deposited by a conformal deposition method such as chemical vapor deposition (CVD). The thickness of the dielectric liner 70 can be from 20 nm to 120 nm, although lesser and greater thicknesses can also be employed.

In one embodiment, the dielectric liner 70 can include a stress-generating material such as stress-generating silicon nitride. The stress-generating silicon nitride can apply a tensile stress or a compressive stress to underlying structures. In another embodiment, a pair of dielectric liners that apply opposite types of stress to underlying structures can be employed in lieu of the dielectric liner 70. In this case, a compressive-stress-generating dielectric liner can be formed over the first gate stack (50A, 52A, 54A, 56A) and a tensile-stress-generating dielectric liner can be formed over the second gate stack (50B, 52B, 54B, 56B), or vice versa. The boundary between the compressive-stress-generating dielectric liner and the tensile-stress-generating dielectric liner can be located over a region including a shallow trench isolation structure 20 such as the region including the third gate stack (50C, 52C, 54C, 56C).

Figure 5:
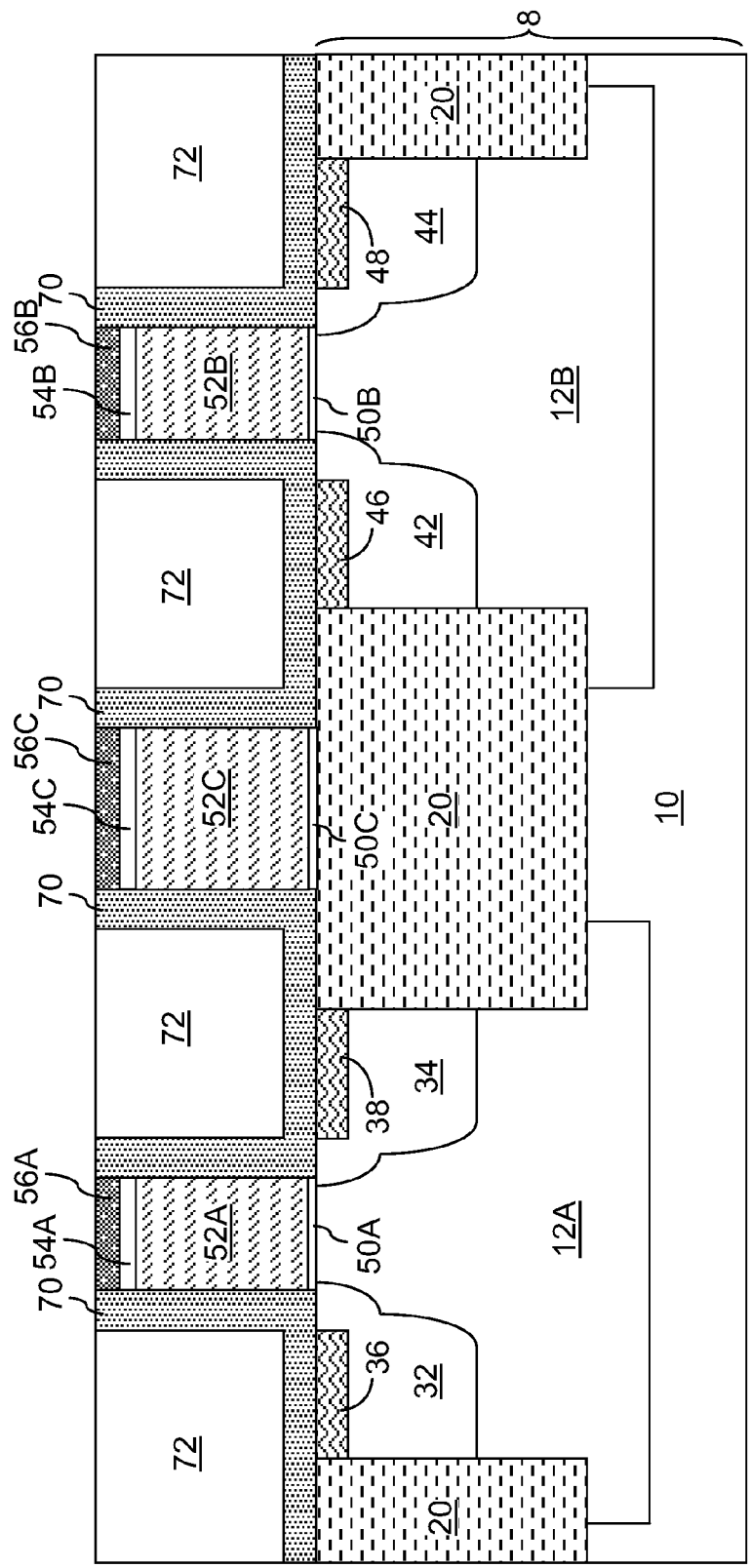

Referring to FIG. 5, a dielectric layer, which is herein referred to a lower contact-level dielectric material layer 72, is deposited over the dielectric liner 70, for example, by chemical vapor deposition (CVD) or by spin-coating. The lower contact-level dielectric material layer 72 becomes a lower part of a dielectric material stack within which contact via structures are subsequently formed. In one embodiment, the lower contact-level dielectric material layer 72 includes a dielectric material that is self-planarizing or may be easily planarized. For example, the lower contact-level dielectric material layer 72 can include undoped silicate glass (USG, i.e., silicon oxide), fluorosilicate glass (FSG), borophosphosilicate glass (BPSG), or porous or non-porous organosilicate glass (OSG) including Si, C, O, H, and optionally N.

Subsequently, the lower contact-level dielectric material layer 72 is planarized in a planarization process herein referred to as a first planarization. During the first planarization, top portions of the dielectric liner 70 are removed from above the various gate stacks. The planarized top surface of the lower contact-level dielectric material layer 72 is coplanar with top surfaces of the first, second, and third lower disposable gate cap dielectric portions (56A, 56B, 56C). The planarization can be performed, for example, by chemical mechanical planarization (CMP), a recess etch, or a combination thereof.

Figure 6:
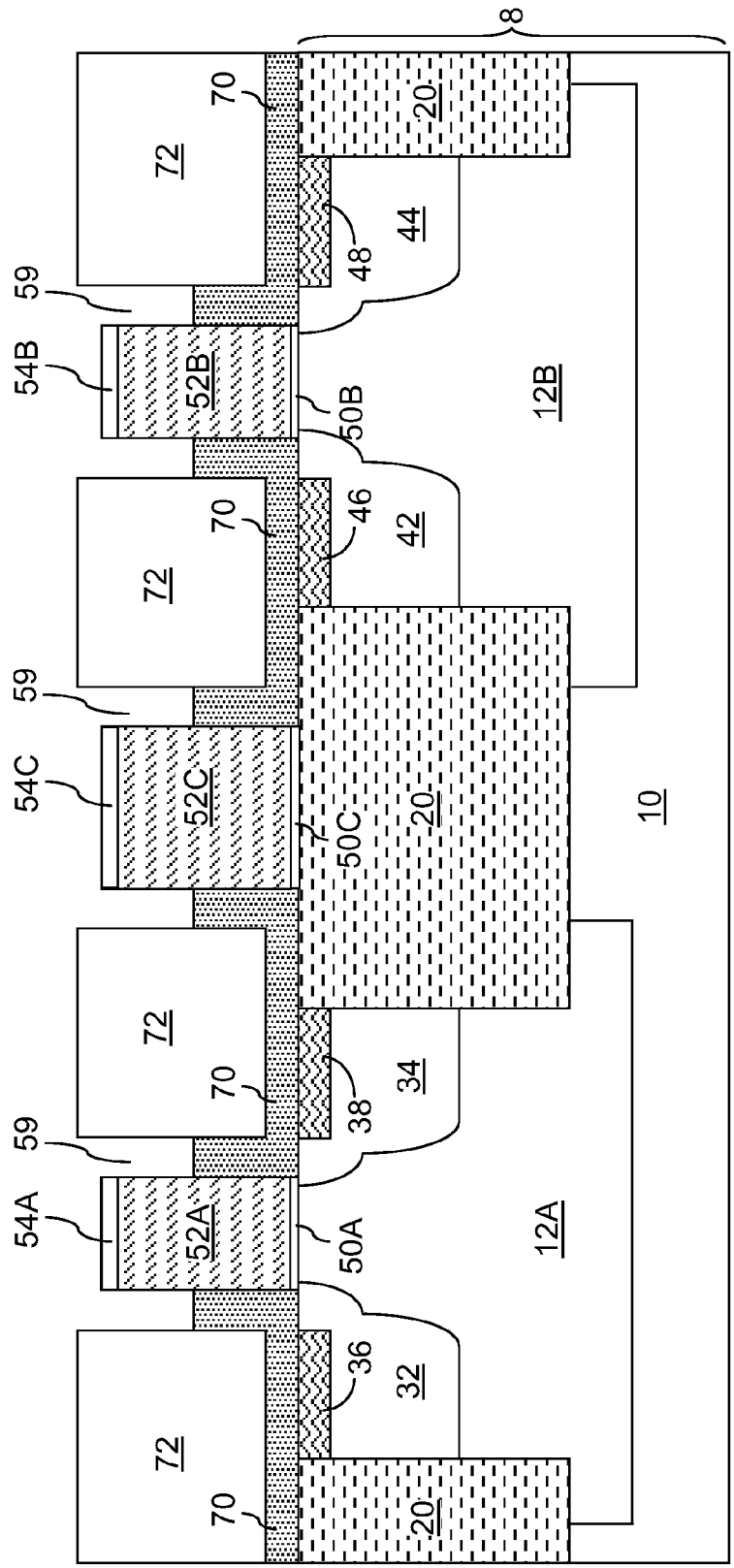

Referring to FIG. 6, upper portions of the dielectric liner 70 are recessed relative to the top surface of the lower contact-level dielectric material layer 72 by a recess etch that etches the dielectric material of the dielectric liner 70 selective to the dielectric material of the lower contact-level dielectric material layer 72. The first, second, and third upper disposable gate cap dielectric portions (54A, 54B, 54C) may be consumed during the recess etch. The top surfaces of the dielectric liner 70 around each of the gate stacks are recessed to a height below the interfaces between the first, second, and third disposable semiconductor material portions (52A, 52B, 52C) and the first, second, and third lower disposable gate cap dielectric portions (54A, 54B, 54C). A recessed region 59 laterally surrounding an upper portion of the gate stack is formed around each gate stack.

Figure 7:
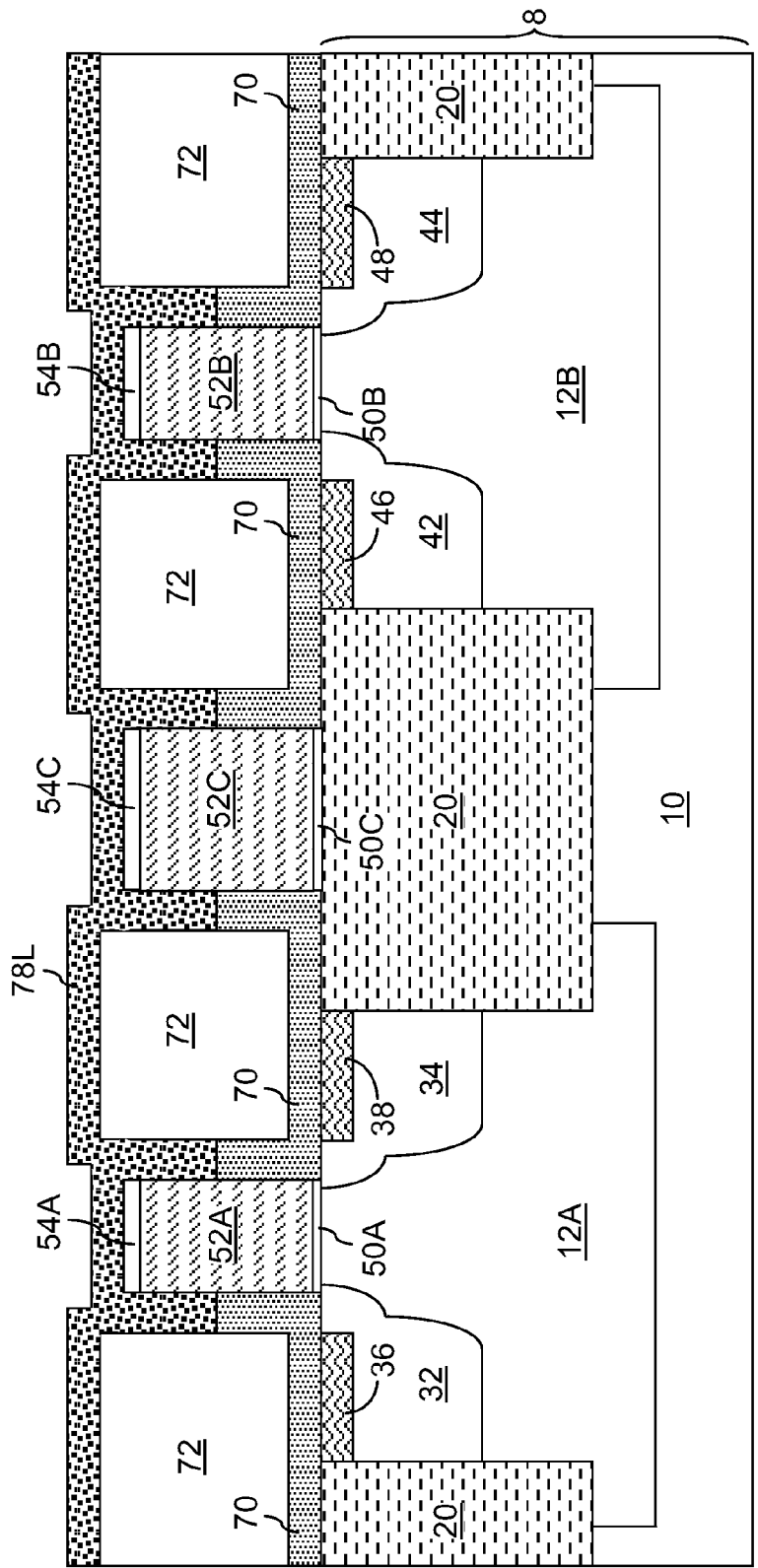

Referring to FIG. 7, a dielectric metal oxide layer 78L is deposited to fill the recessed regions 59 (See FIG. 6) around the upper portion of each gate stack. The dielectric metal oxide layer 78L is formed as a single contiguous layer. The dielectric metal oxide layer 78L can be deposited, for example, by chemical vapor deposition (CVD), physical vapor deposition (PVD), molecular beam deposition (MBD), pulsed laser deposition (PLD), liquid source misted chemical deposition (LSMCD), or atomic layer deposition (ALD). In one embodiment, the dielectric metal oxide layer 78L is deposited as a conformal layer having a constant thickness throughout. The thickness of the dielectric metal oxide layer 78L is greater than one half of the thickness of the dielectric liner 70 so that the recessed regions 59 are completely filled. The dielectric metal oxide layer can include a high dielectric constant (high-k) dielectric material having a dielectric constant greater than 8.0. For example, the dielectric metal oxide layer 78L can include a material selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from 0.5 to 3 and each value of y is independently from 0 to 2.

Figure 8:
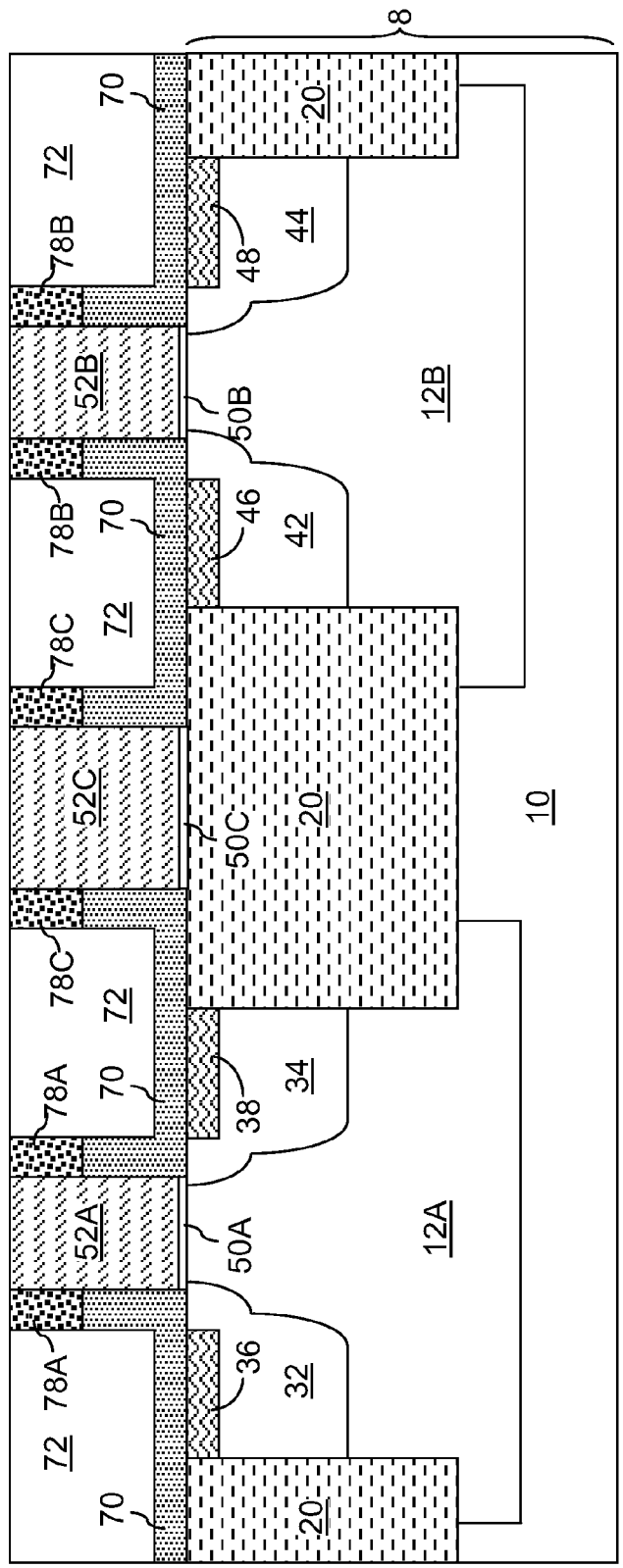

Referring to FIG. 8, another planarization process, which is herein referred to as a second planarization, is performed to remove horizontal portions of the dielectric metal oxide layer 78L and the first, second, and third lower disposable gate cap dielectric portions (54A, 54B, 54C). The second planarization can be performed by chemical mechanical planarization (CMP), a recess etch, or a combination thereof. The top surfaces of the first, second, and third disposable semiconductor material portions (52A, 52B, 52C) are exposed after the second planarization. The second planarization removed horizontal portions of the dielectric metal oxide layer 78L. The remaining portions of the dielectric metal oxide layer 78L filling recessed regions around each gate stack constitute various dielectric metal oxide spacers. For example, a first dielectric metal oxide spacer 78A is formed on upper sidewalls of the first disposable semiconductor material portion 52A included within the first gate stack (50A, 52A), a second dielectric metal oxide spacer 78B is formed on upper sidewalls of the second disposable semiconductor material portion 52B included within the second gate stack (50B, 52B), and a third dielectric metal oxide spacer 78C is formed on upper sidewalls of the third disposable semiconductor material portion 52C included within the first gate stack (50C, 52C).

If chemical mechanical planarization is employed as a sole process or as a last process during the second planarization, each of the first, second, and third dielectric metal oxide spacers (78A, 78B, 78C) have a horizontal planar top surface, which is coplanar with top surfaces of the lower contact-level dielectric material layer 72 and the first, second, and third disposable semiconductor material portions (52A, 52B, 52C). A periphery of the top surface of the dielectric liner 70 around each gate stack coincides with a periphery of a bottom surface of a dielectric metal oxide spacer (78A, 78B, or 78C). The lower contact-level dielectric material layer 72 overlies horizontal portions of the dielectric liner 70, and has a contiguous top surface that is coplanar with top surfaces of the dielectric metal oxide spacers (78A, 78B, 78C).

Figure 9:
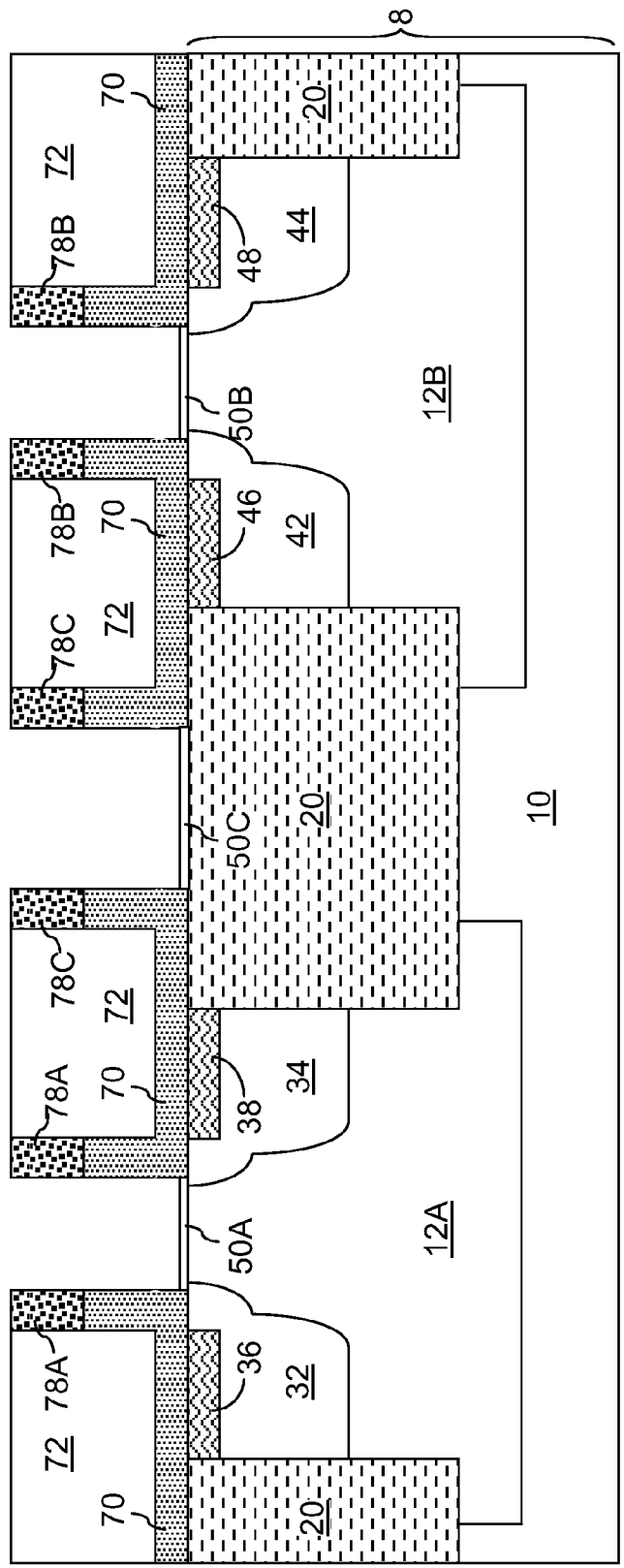

Referring to FIG. 9, the first, second, and third disposable semiconductor material portions (52A, 52B, 52C) are removed selective to the gate dielectrics (50A, 50B, 50C), the dielectric metal oxide spacers (78A, 78B, 78C), and the lower contact-level dielectric material layer 72, for example, by an anisotropic etch such as a reactive ion etch or an isotropic etch such as a wet etch. For example, if the first, second, and third disposable semiconductor material portions (52A, 52B, 52C) include germanium, a wet etch employing hydrogen peroxide can be employed to remove the first, second, and third disposable semiconductor material portions (52A, 52B, 52C). Etch processes that remove other semiconductor materials selective to dielectric materials are known in the art.

Figure 10:
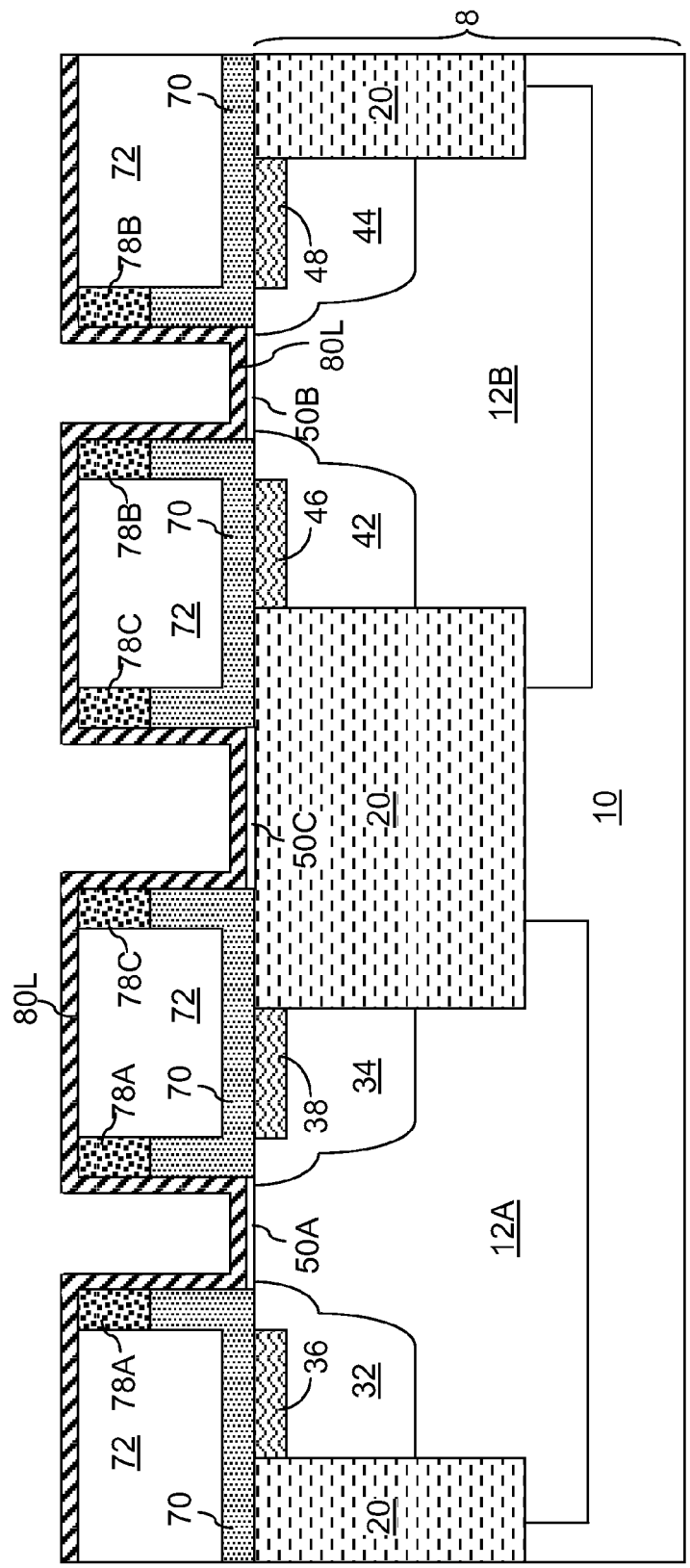

Referring to FIG. 10, at least one conductive material is deposited in the cavities that are formed by removal of the disposable semiconductor material portions (52A, 52B, 52C). For example, a first work-function-metal layer 80L can be deposited as a contiguous layer on exposed surfaces of the gate dielectrics (50A, 50B, 50C), the dielectric liner 70, the dielectric metal oxide spacers (78A, 78B, 78C), and the lower contact-level dielectric material layer 72 by chemical vapor deposition (CVD), physical vapor deposition (PVD), molecular beam deposition (MBD), pulsed laser deposition (PLD), liquid source misted chemical deposition (LSMCD), or atomic layer deposition (ALD). A "work-function-metal" refers to a metal that affects the work function of a gate electrode of a field effect transistor.

The first work-function-metal layer 80L includes a first metal, which has a first work function. The first metal of the first work-function-metal layer 80L can be selected to optimize the performance of a transistor to be subsequently formed employing the second source and drain regions (42, 44) and the first conductivity type well 12B. The thickness of the first work-function-metal layer 80L is typically set at a value from 2 nm to 30 nm, and more typically, from 3 nm to 10 nm, although lesser and greater thicknesses can also be employed.

In one embodiment, the first conductivity type is n-type and the semiconductor material of the first conductivity type well 12B includes p-doped silicon, and the first work-function-metal layer 80L includes a silicon conduction band edge metal such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the first work-function-metal layer 80L can be a layer of TiAl.

In another embodiment, the first conductivity type is p-type and the semiconductor material of the first conductivity type well 12B includes p-doped silicon, and the first work-function-metal layer 80L includes a silicon conduction band edge metal such as Pt, Rh, Ir, Ru, Cu, Os, Be, Co, Pd, Te, Cr, Ni, TiN, and alloys thereof. For example, the first work-function-metal layer 80L can be a layer of TiN.

Figure 11:
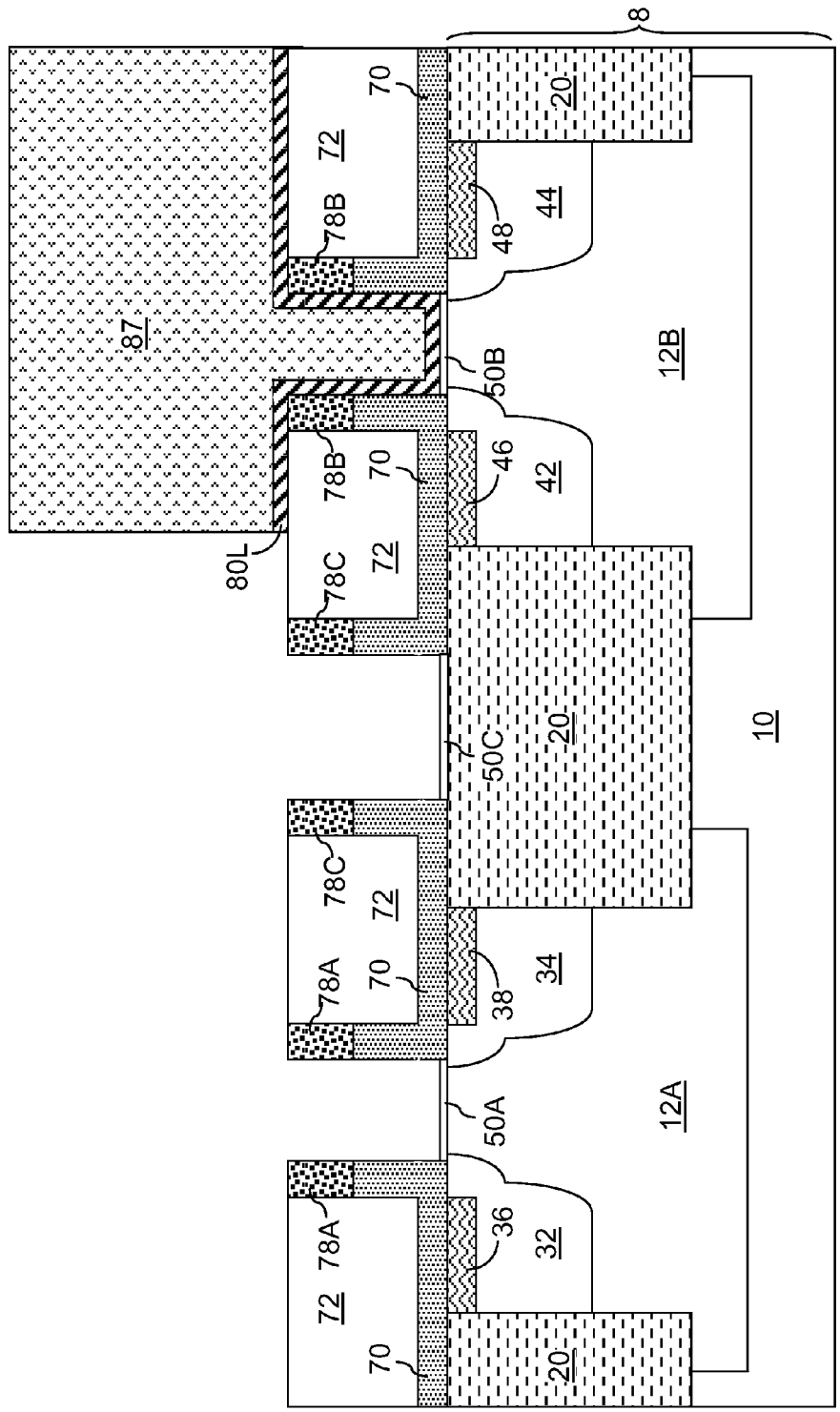

Referring to FIG. 11, a photoresist 87 is applied over the first work-function-metal layer 80L and lithographic patterned so that the photoresist 87 fills a cavity surrounded by the second dielectric metal oxide spacer 78B and overlies the second dielectric metal oxide spacer 78B, while the first work-function-metal layer 80L is exposed over the first gate dielectric 50A. The portion of the first work-function-metal layer 80L may be, or may not be, exposed over the third gate dielectric 50C depending on the type of gate electrode to be formed therein. The exposed portion of the first work-function-metal layer 80L is removed by an etch, which can be an isotropic etch such as a wet etch. The photoresist 87 is subsequently removed, for example, by ashing.

Figure 12:
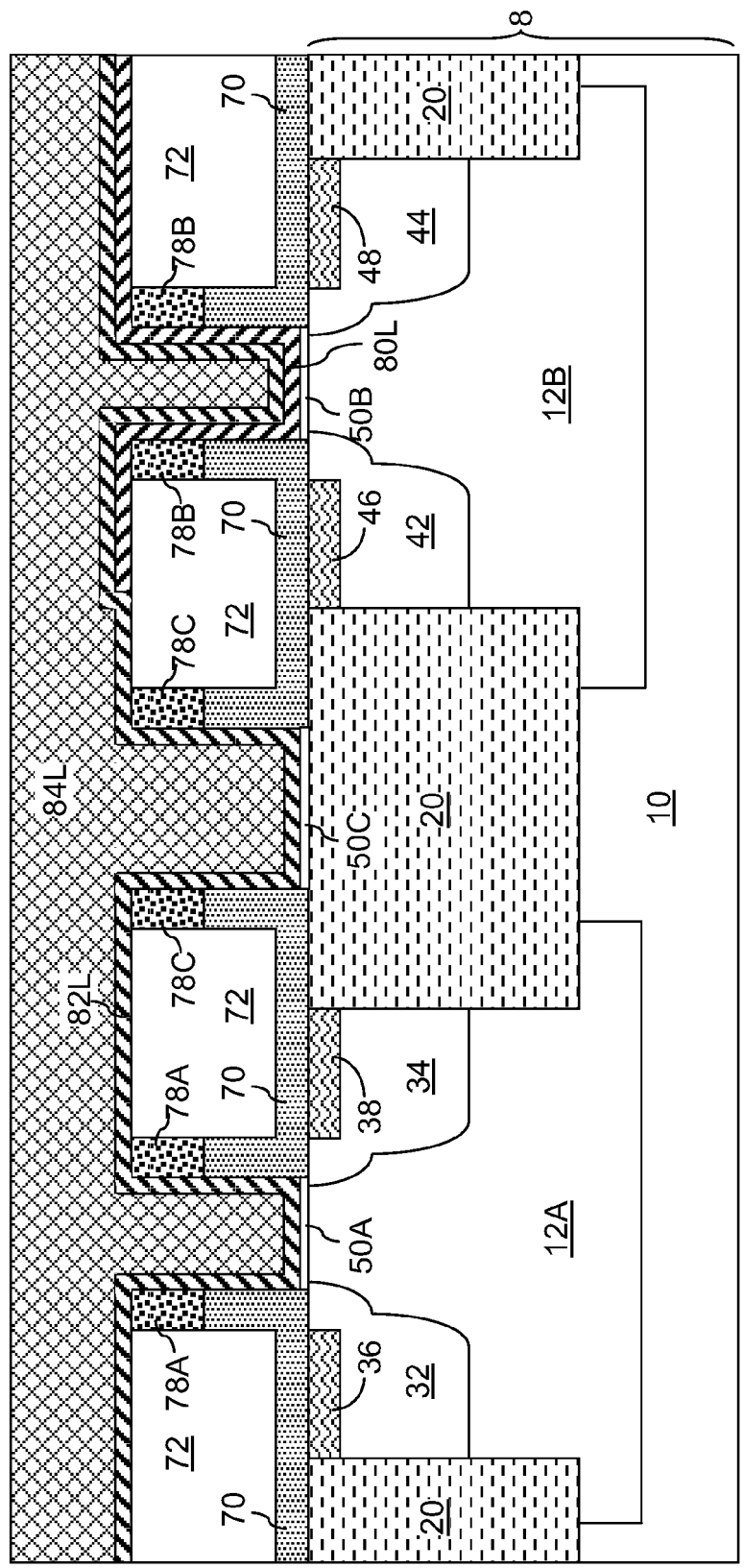

Referring to FIG. 12, a second work-function-metal layer 82L and a conductive material layer 84L are deposited on the remaining portion of the first work-function-metal layer 80L, a top surface of the first gate dielectric 50A, the inner sidewalls of the dielectric liner 70, and the exposed surfaces of the dielectric metal oxide spacers (78A, 78B, 78C), and the lower contact-level dielectric material layer 72. The second work-function-metal layer 82L includes a second metal having a second work function, which is different from the first work function. The second metal of the second work-function-metal layer 82L is selected to optimize the performance of a transistor to be subsequently formed employing the first source and drain regions (32, 34) and the second conductivity type well 12A.

In one embodiment, the first conductivity type is n-type and the semiconductor material of the second conductivity type well 12A includes p-doped silicon, and the second workfunction-metal layer 82L includes a silicon conduction band edge metal such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the second work-function-metal layer 82L can be a layer of TiAl.

In another embodiment, the first conductivity type is p-type and the semiconductor material of the second conductivity type well 12A includes n-doped silicon, and the second work-function-metal layer 82L includes a silicon valence band edge metal such as Pt, Rh, Ir, Ru, Cu, Os, Be, Co, Pd, Te, Cr, Ni, TiN, and alloys thereof. For example, the second work-function-metal layer 82L can be a layer of TiN.

The second work-function-metal layer 82L can be formed, for example, by physical vapor deposition, chemical vapor deposition, or atomic layer deposition (ALD). The thickness of the second work-function-metal layer 82L is typically set at a value from 2 nm to 100 nm, and more typically, from 3 nm to 10 nm, although lesser and greater thicknesses can also be employed.

The conductive material layer 84L is a gate conductor layer that includes a conductive material employed for inner portions of gate electrodes. The conductive material layer 84L is deposited on the second work-function-metal layer 82L, for example, by chemical vapor deposition, physical vapor deposition, or a combination thereof. All gate cavities are completely filled by combinations of the conductive material layer 84L, the second work-function-metal layer 82L, and optionally the first work-function-metal layer 80L. The conductive material layer 84L includes a conductive material such as a metal or a doped semiconductor material.

Figure 13:
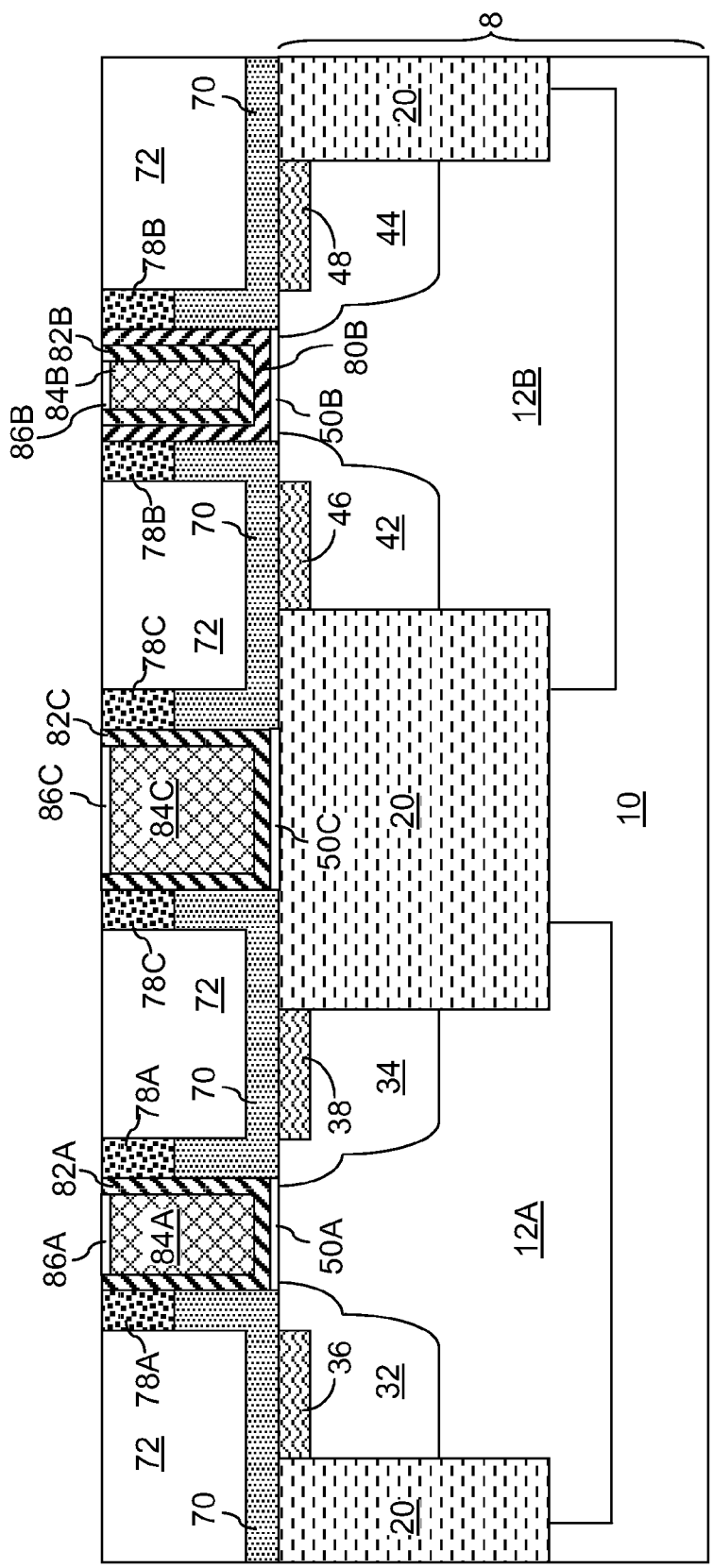

Referring to FIG. 13, the portions of the conductive material layer 84L, the second work-function-metal layer 82L, and the first work-function-metal layer 80L located above the top surface of the lower contact-level dielectric material layer 72 are removed by planarization, which can employ chemical mechanical planarization (CMP), a recess etch, or a combination thereof. Remaining portions of the conductive material layer 84L constitute a first gate conductor 84A, a second gate conductor 84B, and a third gate conductor 84C, which are located in a first gate stack, a second gate stack, and a third gate stack, respectively. Remaining portions of the second work-function-metal layer 82L constitute a first work-function-metal portion 82A, an inner work-function-metal portion 82B, and a third work-function-metal portion 82C, which are located in a first gate stack, a second gate stack, and a third gate stack, respectively. A remaining portion of the first work-function-metal layer 80L constitutes an outer work-function-metal portion 80B, which is located in the second gate stack.

Each of the first work-function-metal portion 82A, the inner work-function-metal portion 82B, the third work-function-metal portion 82C, and the outer work-function-metal portion 80B is a conductive metal portion. A first gate electrode includes the first work-function-metal portion 82A and the first gate conductor 84A, a second gate electrode includes the outer work-function-metal portion 80B, the inner work-function-metal portion 82B, and the second gate conductor 84B, and a third gate electrode includes the third work-function-metal portion 82C and the third gate conductor 84C.

Depending on the material of the conductive material layer 84L, metal compound portions may be formed at the top of the first gate conductor 84A, the second gate conductor 84B, and the third gate conductor 84C. Specifically, a first metal compound portion 86A, a second metal compound portion 86B, and a third metal compound portion 86C may be formed on the top surface of the first gate conductor 84A, the second gate conductor 84B, and the third gate conductor 84C, respectively. For example, if the conductive material layer 84L predominantly includes aluminum, the first gate conductor 84A, the second gate conductor 84B, and the third gate conductor 84C can include aluminum oxide having a thickness of about 5 nm.

After the planarization, the top surfaces of the dielectric metal oxide spacers (78A, 78B, 78C) are coplanar with the top surface of the lower contact-level dielectric material layer 72 and the top surfaces of the first work-function-metal portion 82A, the inner work-function-metal portion 82B, the third work-function-metal portion 82C, and the outer work-function-metal portion 80B. Further, if the top surfaces of the first metal compound portion 86A, the second metal compound portion 86B, and the third metal compound portion 86C are present, the top surfaces of the dielectric metal oxide spacers (78A, 78B, 78C) are coplanar with the top surfaces of the first metal compound portion 86A, the second metal compound portion 86B, and the third metal compound portion 86C. Otherwise, the top surfaces of the dielectric metal oxide spacers (78A, 78B, 78C) are coplanar with the top surfaces of the first gate conductor 84A, the second gate conductor 84B, and the third gate conductor 84C.

The first dielectric metal oxide spacer 78A contacts an upper portion of the first gate electrode (82A, 84A). The second dielectric metal oxide spacer 78B contacts an upper portion of the second gate electrode (80B, 82B, 84B). The third dielectric metal oxide spacer 78C contacts an upper portion of the third gate electrode (82C, 84C). The lower contact-level dielectric material layer 72 bottom surfaces of the first, second, and third metal oxide spacers (78A, 78B, 78C) and lower portions of the various gate electrodes.

A first field effect transistor is formed in the region of the second conductivity type well 12A. The first field effect transistor includes the second conductivity type well 12A, the first source and drain regions (32, 34), and the first gate stack including the first gate dielectric 50A and the first gate electrode (82A, 84A). A second field effect transistor is formed in the region of the first conductivity type well 12B. The second field effect transistor includes the first conductivity type well 12B, the second source and drain regions (42, 44), the second gate stack including the second gate electrode 50B and the second gate stack (80B, 82B, 84B).

Figure 14:
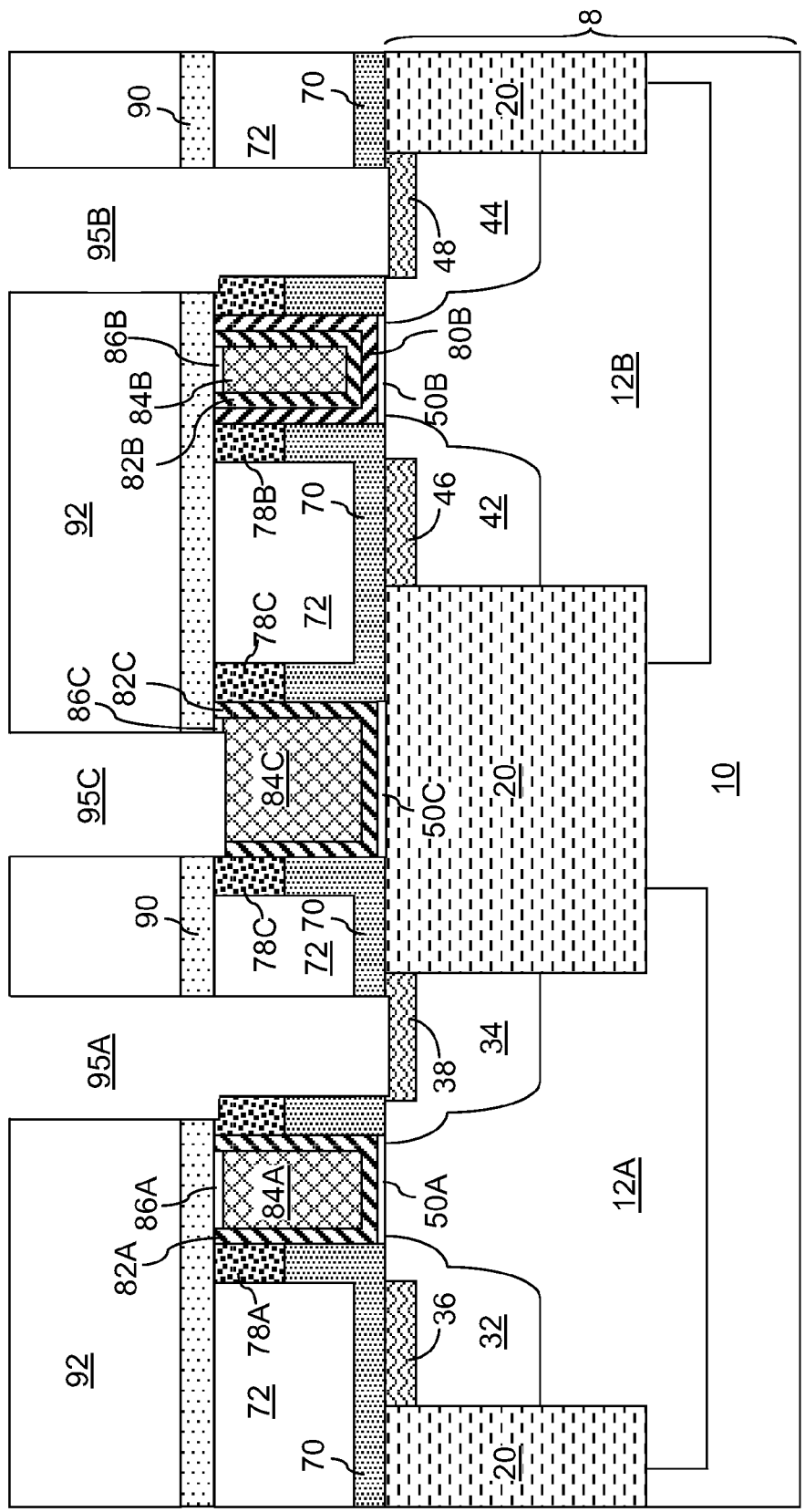

Referring to FIG. 14, at least one upper contact-level dielectric material layer is formed over the lower contact-level dielectric material layer 72. The at least one upper contact-level dielectric material layer can include, for example, a first upper contact-level dielectric material layer 90 and a second upper contact-level dielectric material layer 92. For example, the first upper contact-level dielectric material layer 90 can include silicon nitride or silicon oxide, and the second contact-level dielectric material layer 92 can include silicon oxide or porous or non-porous organosilicate glass.

Various contact via holes are formed from the top surface of the at least one upper contact-level dielectric material layer (90, 92) to at least one terminal of the field effect transistors. For example, a first contact via hole 95A can extend through the at least one upper contact-level dielectric material layer (90, 92), the lower contact-level dielectric material layer 72, and the dielectric liner 70 to a first metal-semiconductor-alloy region 38. A second contact via hole 95B can extend through the at least one upper contact-level dielectric material layer (90, 92), the lower contact-level dielectric material layer 72, and the dielectric liner 70 to a second metal-semiconductor-alloy region 48. A third contact via hole 95C can extend through the at least one upper contact-level dielectric material layer (90, 92) to the third gate electrode (82C, 84C).

The various contact via holes (95A, 95B, 95C) can be formed, for example, by applying a photoresist (not shown) on the top surface of the at least one upper contact-level dielectric material layer (90, 92), lithographically patterning openings in the photoresist, and transferring the pattern of the openings in the photoresist through the at least one upper contact-level dielectric material layer (90, 92), the lower contact-level dielectric material layer 72, and the dielectric liner 70. Because the various dielectric metal oxide spacers (78A, 78B, 78C) are more etch resistant to the etchants employed to form the various contact via holes (95A, 95B, 95C) than the dielectric liner 70, the various dielectric metal oxide spacers (78A, 78B, 78C) effectively blocks the etching of material of the dielectric liner 70 even if the lateral positions of the various contact via holes (95A, 95B, 95C) deviate from ideal target positions, for example, by overlay variations during lithographic patterning of the openings in the photoresist. Thus, the lateral extent of the first and second contact via holes (95A, 95B) is limited by the various dielectric metal oxide spacers (78A, 78B, 78C) at the top surface of the semiconductor substrate 8, and contact areas at the bottom of the first and second contact via holes (95A, 95B) are self-aligned to the various dielectric metal oxide spacers (78A, 78B, 78C).

Figure 15:
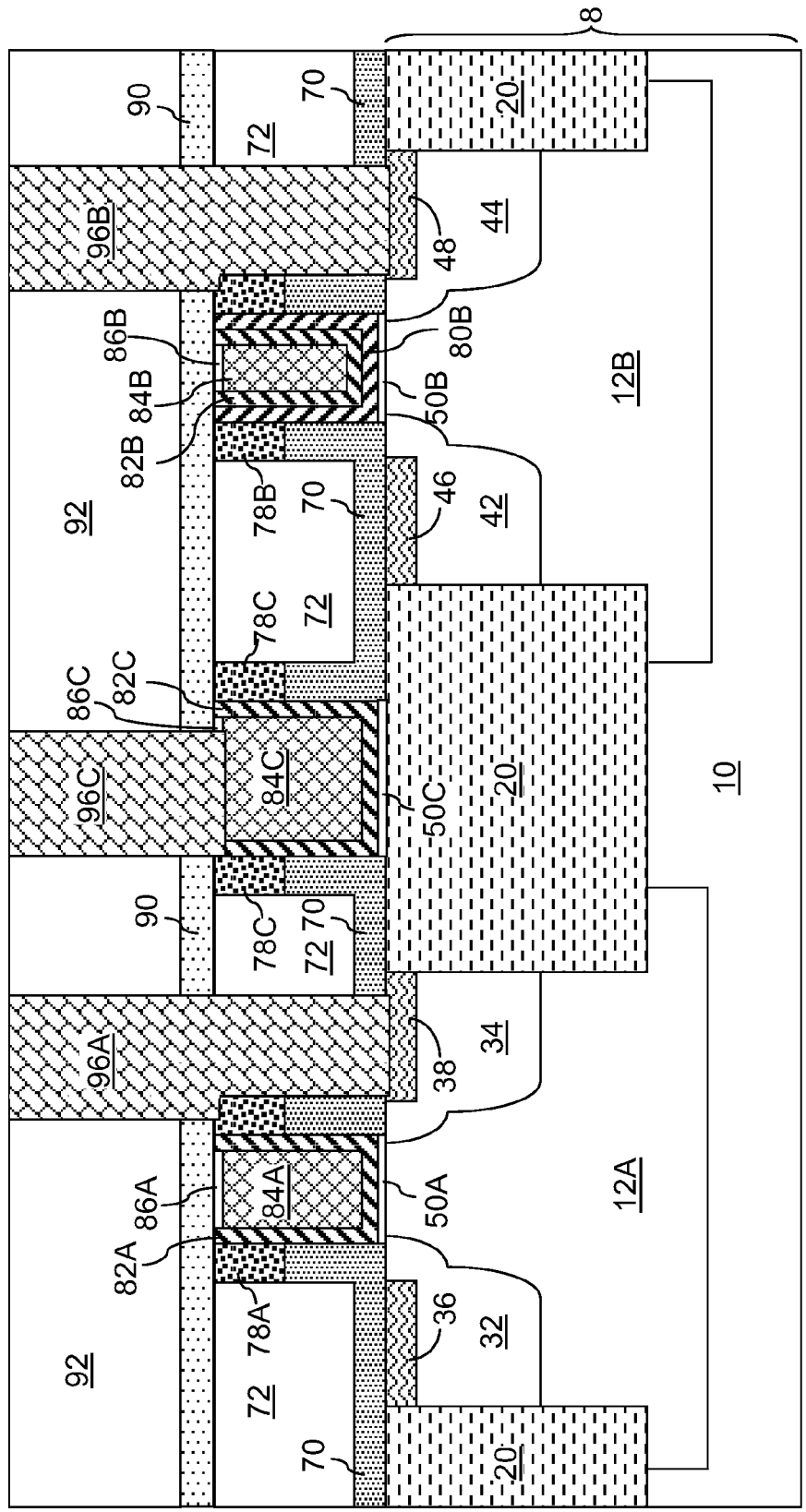

Referring to FIG. 15, various self-aligned contact via structures are formed, for example, by deposition of a conductive material in the various contact via holes (95A, 95B, 95C) and removal of excess conductive material from above the at least one upper contact-level dielectric material layer (90, 92) by planarization, which can employ a recess etch or chemical mechanical planarization. The various contact via structures can include a first contact via structure 96A that fills the first contact via hole 95A, a second contact via structure 96B that fills the second contact via hole 95B, and a third contact via structure 96C that fills the third contact via hole 95C. The first contact via structure 96A and the second contact via structure 96B extend through the at least one upper contact-level dielectric material layer (90, 92), the lower contact-level dielectric material layer 72, and the dielectric liner 70, and contact the semiconductor substrate 8 and one of the first dielectric metal oxide spacer 78A and the second dielectric metal oxide spacer 78B. Specifically, each of the first contact via structure 96A and the second contact via structure 96B contacts a single sidewall of a dielectric metal oxide spacer (78A or 78B) and an upper surface of the dielectric metal oxide spacer (78A or 78B) that is vertically recessed from a topmost surface of the dielectric metal oxide spacer (78A or 78B). Each of the first contact via structure 96A and the second contact via structure 96B can contact a metal-semiconductor-alloy portion (38 or 48) located in the semiconductor substrate 8.

Figure 16:
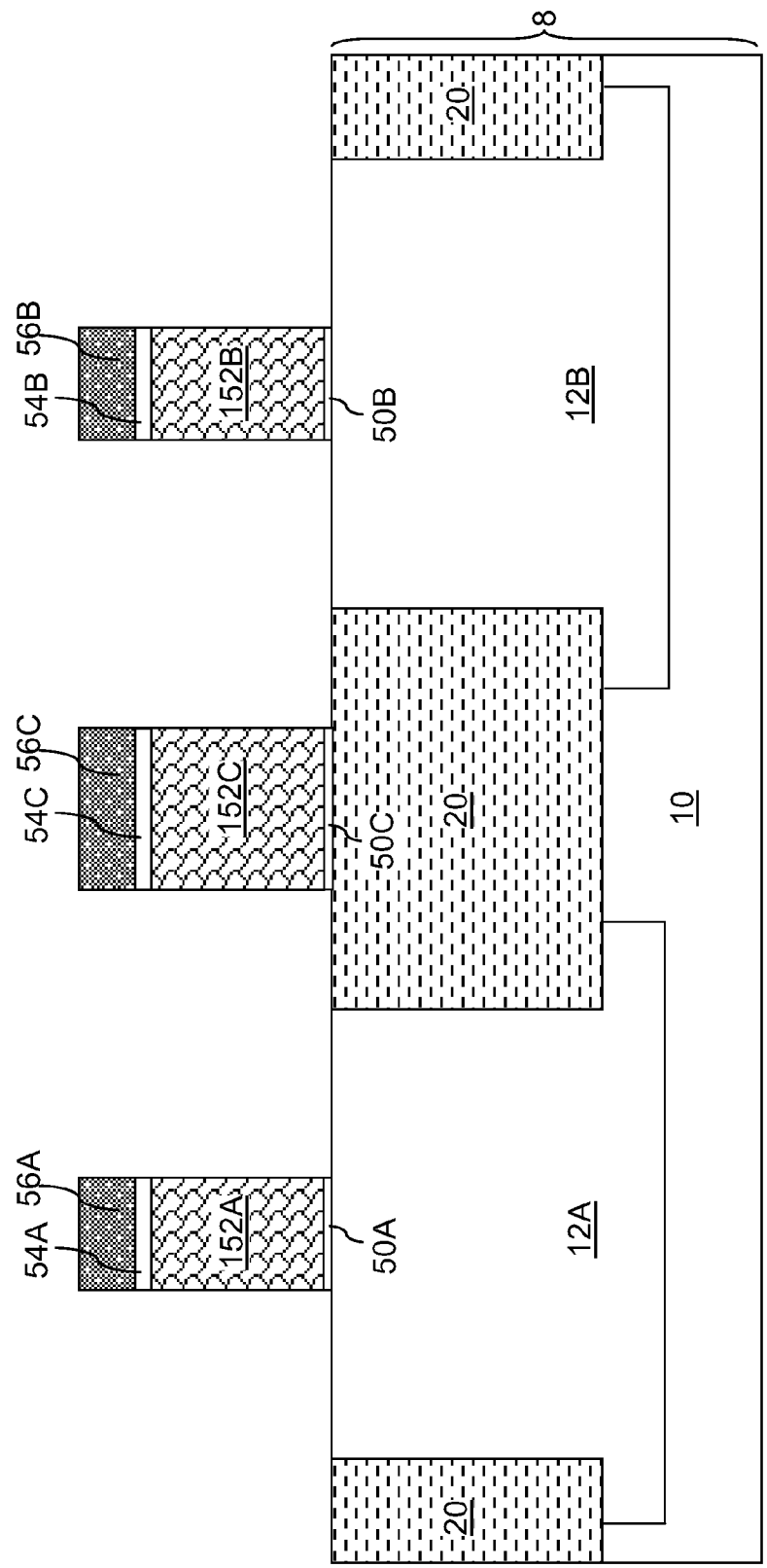
FIGS. 16-25 are sequential vertical cross-sectional view of a second exemplary semiconductor structure according to a second embodiment of the present disclosure.

Referring to FIG. 16, a second exemplary semiconductor structure according to a second embodiment of the present disclosure can be formed employing the same methods of the first embodiment of the present disclosure as illustrated in FIG. 1 with the modification that each gate stack includes, from bottom to top, a gate dielectric, a non-disposable gate electrode, a lower disposable gate cap dielectric portion, and an upper disposable gate cap dielectric portion. For example, a first gate stack includes, from bottom to top, a first gate dielectric 50A, a first gate electrode 152A, a first lower disposable gate cap dielectric portion 54A, and a first upper disposable gate cap dielectric portion 56A. A second gate stack includes, from bottom to top, a second gate dielectric 50B, a second gate electrode 152B, a second lower disposable gate cap dielectric portion 54B, and a second upper disposable gate cap dielectric portion 56B. A third gate stack includes, from bottom to top, a third gate dielectric 50C, a third gate electrode 152C, a third lower disposable gate cap dielectric portion 54C, and a third upper disposable gate cap dielectric portion 56C.

The first, second, and third gate electrodes (152A, 152B, 152C) can include doped semiconductor materials such as doped polysilicon, doped germanium-containing material, or doped compound semiconductor material. Alternatively or in addition, the first, second, and third gate electrodes (152A, 152B, 152C) may include a metallic material such as the metallic materials employed for the first work-function-metal layer 80L (See FIG. 10), the second work-function-metal layer 82L (See FIG. 12), and/or the conductive material layer 84 (See FIG. 12). The thickness of the first, second, and third gate electrodes (152A, 152B, 152C) can be from 50 nm to 300 nm, although lesser and greater thicknesses can also be employed.

Figure 17:
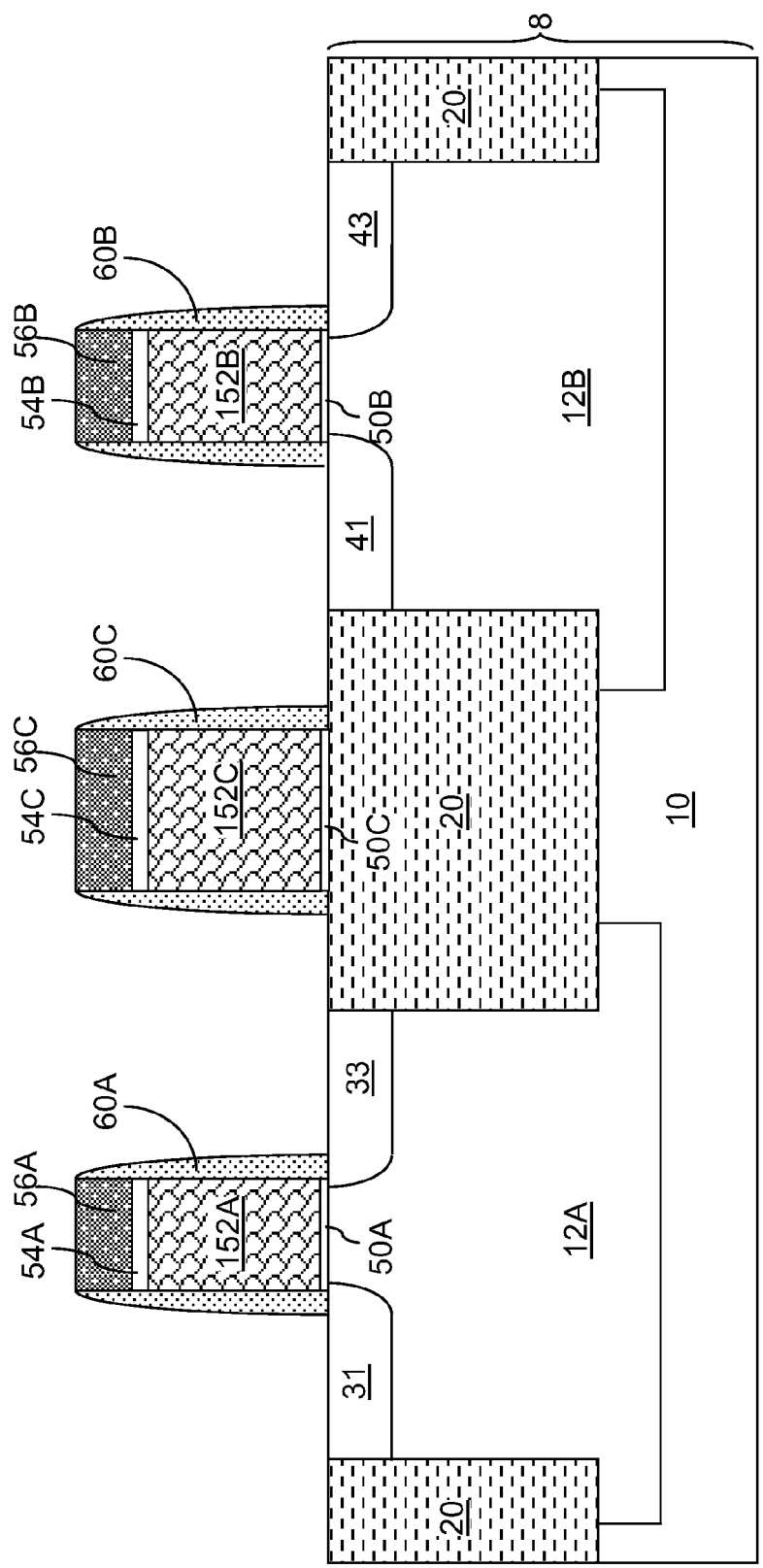

Referring to FIG. 17, the same processing steps as the processing steps of FIG. 2 of the first embodiment can be employed to form inner dielectric spacers (60A, 60B, 60C) and various source and drain extension regions (31, 33, 41, 43).

Figure 18:
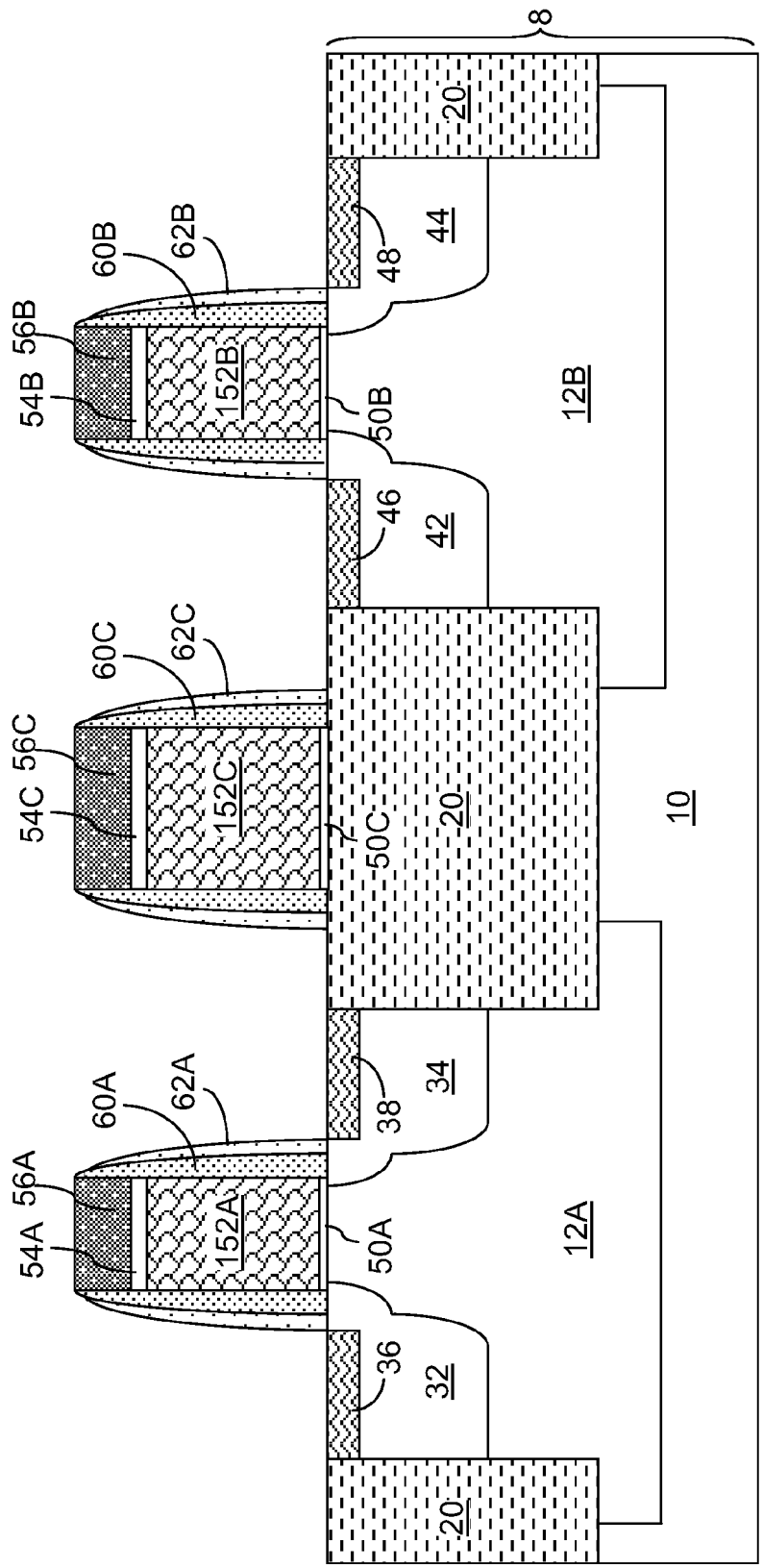

Referring to FIG. 18, the same processing steps as the processing steps of FIG. 3 of the first embodiment can be employed to form outer dielectric spacers (62A, 62B, 62C), source and drain regions (32, 34, 42, 44), and metal-semiconductor-alloy regions (36, 38, 46, 48).

Figure 19:
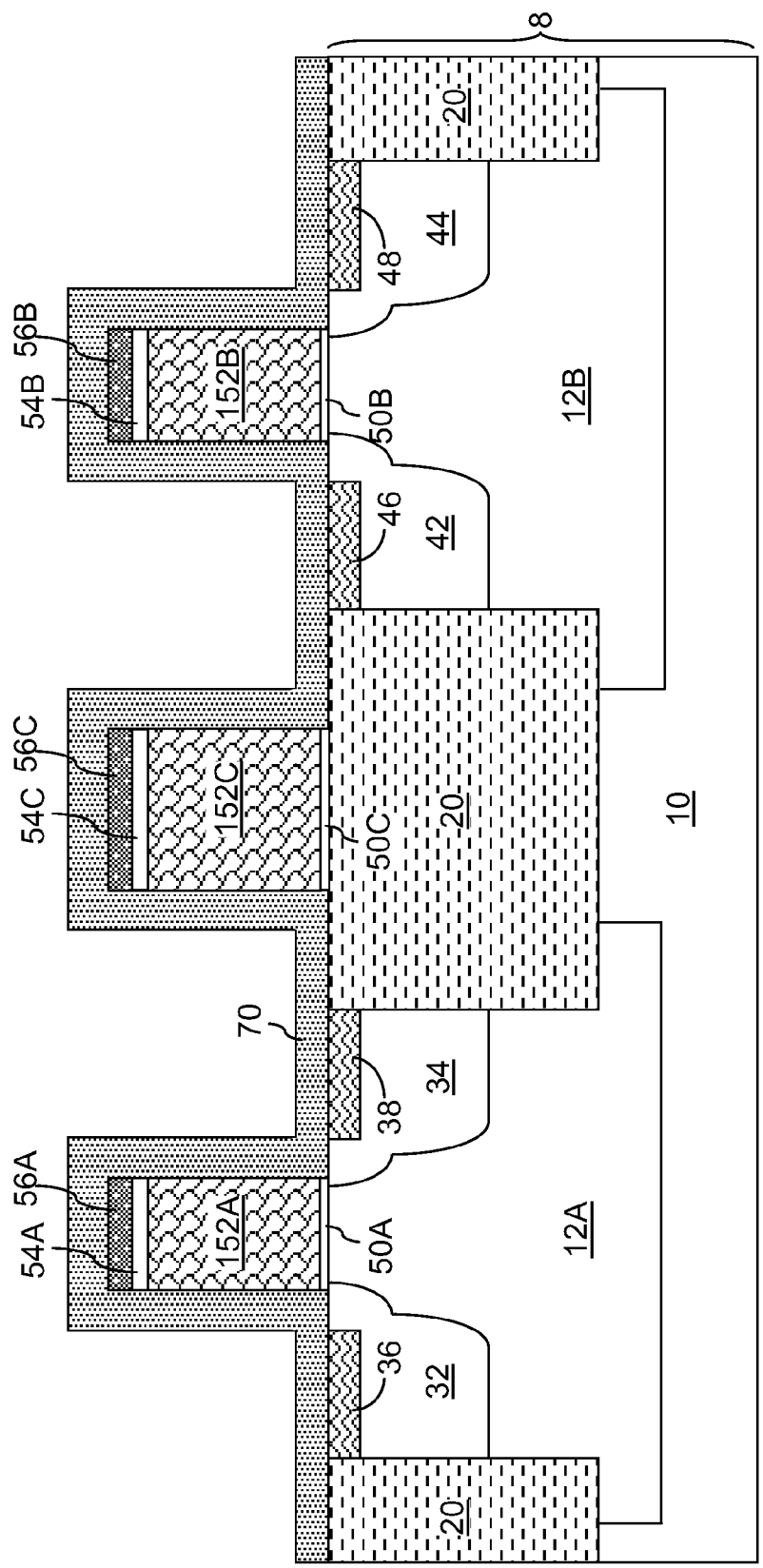

Referring to FIG. 19, the same processing steps as the processing steps of FIG. 4 of the first embodiment can be employed to form a dielectric liner 70 that contacts sidewalls of the various gate electrodes (152A, 152B, 152C).

Figure 20:
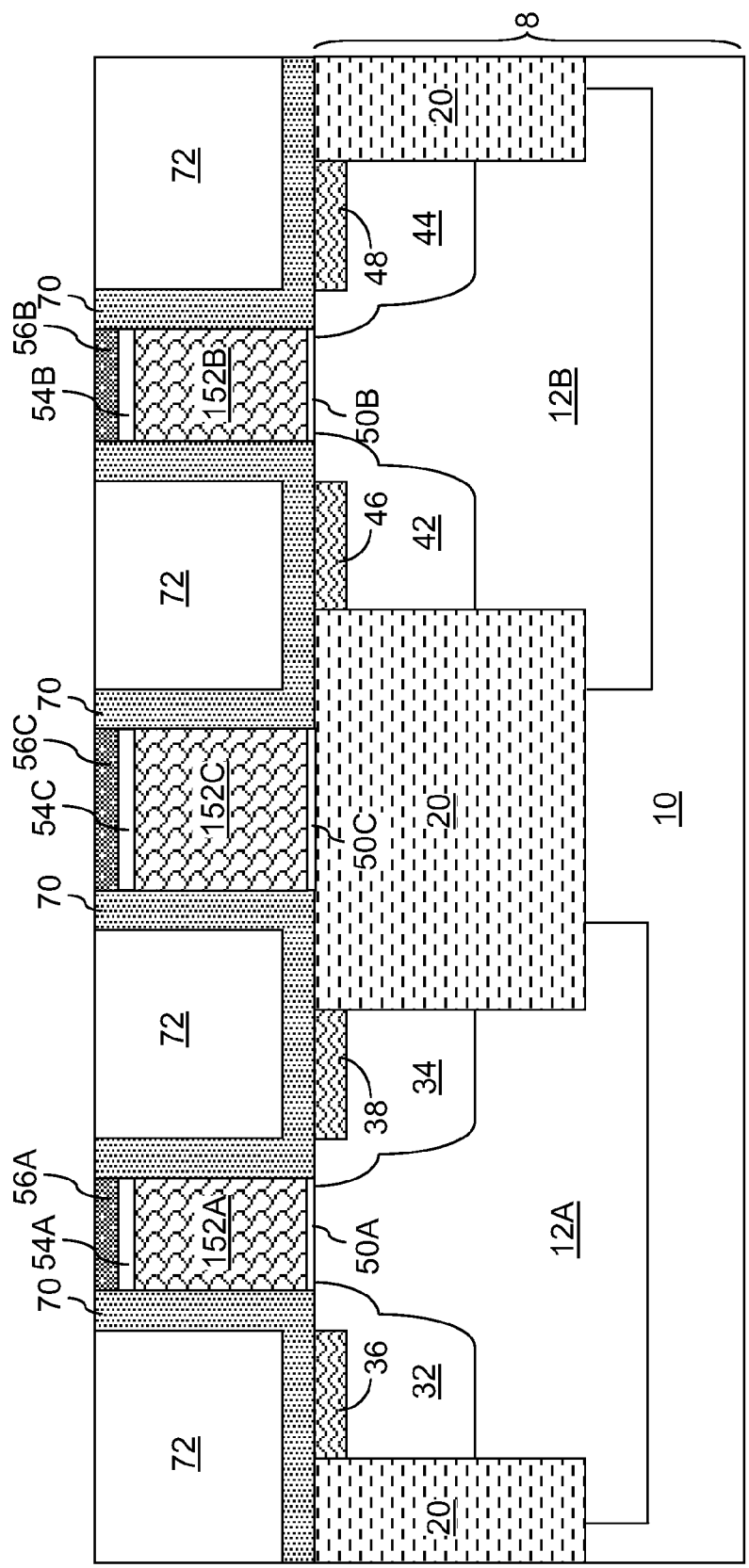

Referring to FIG. 20, the same processing steps as the processing steps of FIG. 5 of the first embodiment can be employed to form a lower contact-level dielectric material layer 72 and to perform the first planarization.

Figure 21:
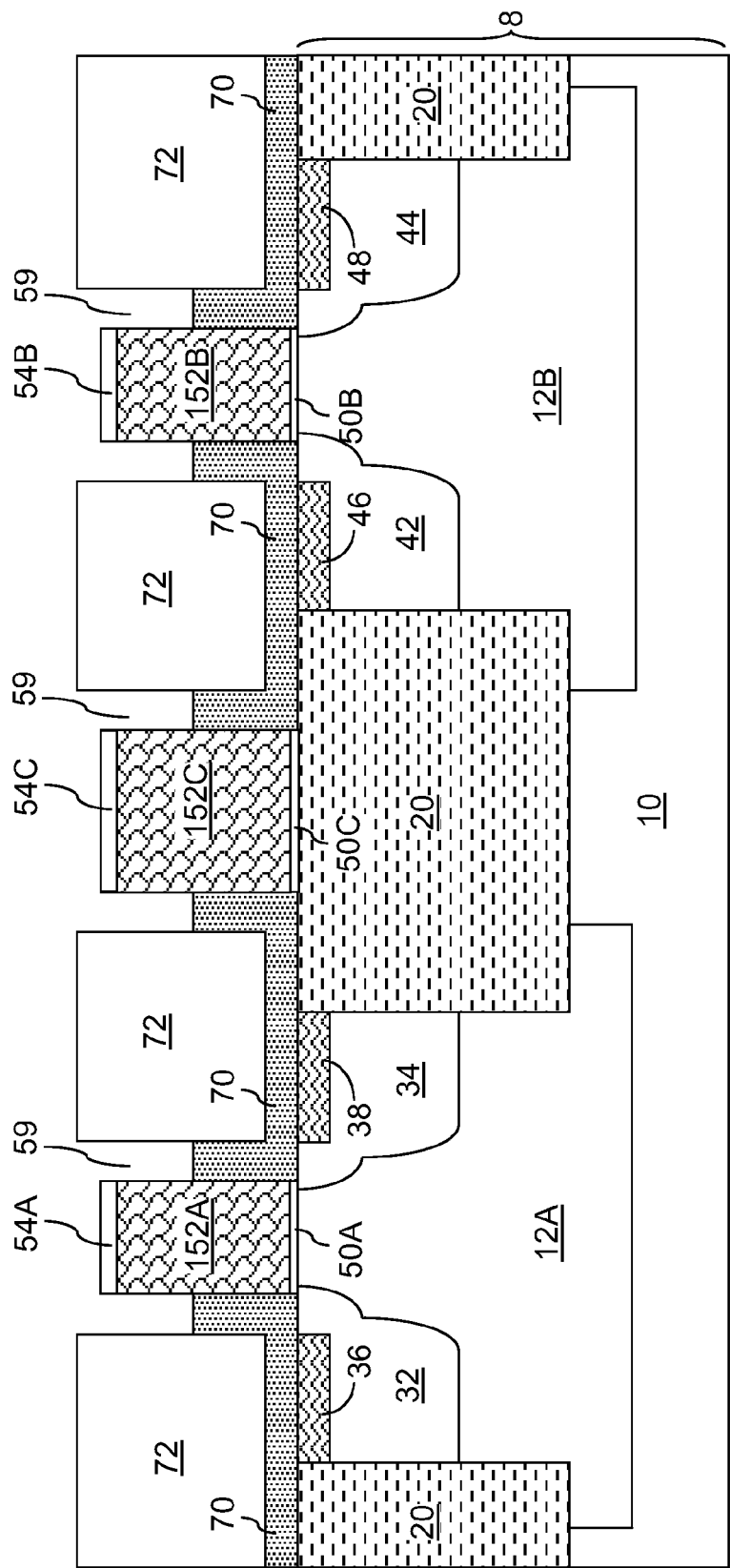

Referring to FIG. 21, the same processing steps as the processing steps of FIG. 6 of the first embodiment can be employed to recess upper portions of the dielectric liner 70. Each recessed region 59 laterally surrounds an upper portion of a gate stack that includes a gate dielectric (50A, 50B, or 50C), a gate electrode (152A, 152B, or 152C), and a lower disposable gate cap dielectric portion (54A, 54B, or 54C).

Figure 22:
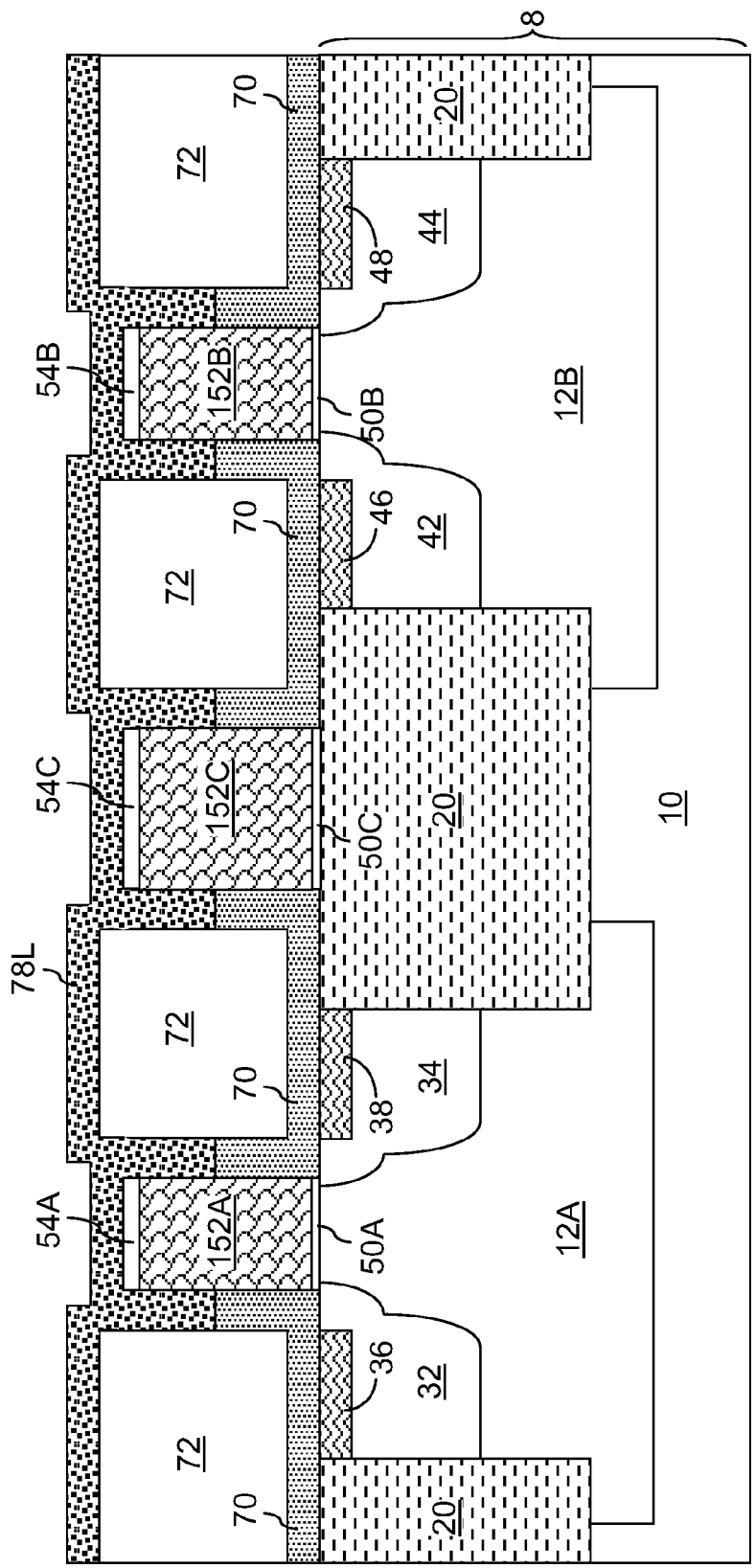

Referring to FIG. 22, the same processing steps as the processing steps of FIG. 7 of the first embodiment can be employed to deposit a dielectric metal oxide layer 78L.

Figure 23:
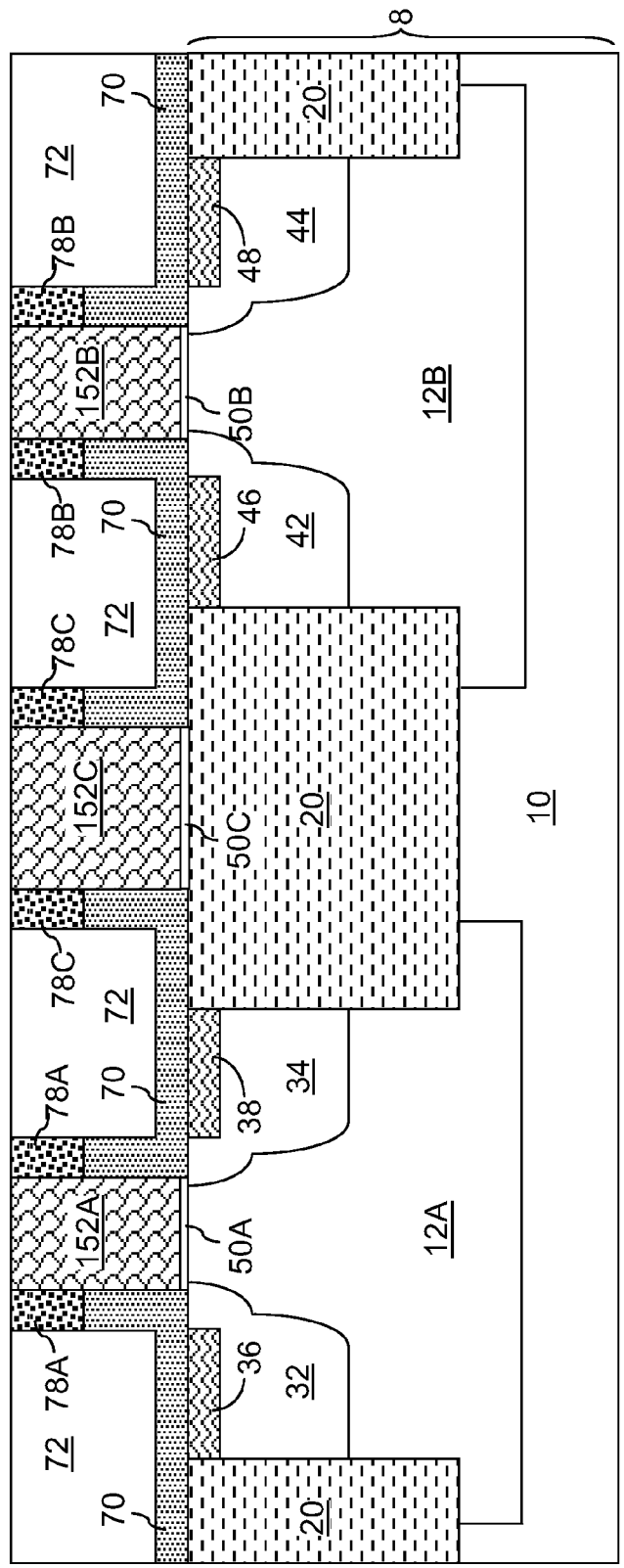

Referring to FIG. 23, the same processing steps as the processing steps of FIG. 8 of the first embodiment can be employed to perform a second planarization. Top surfaces of the gate electrodes (152A, 152B, 152C) are exposed after the second planarization.

Figure 24:
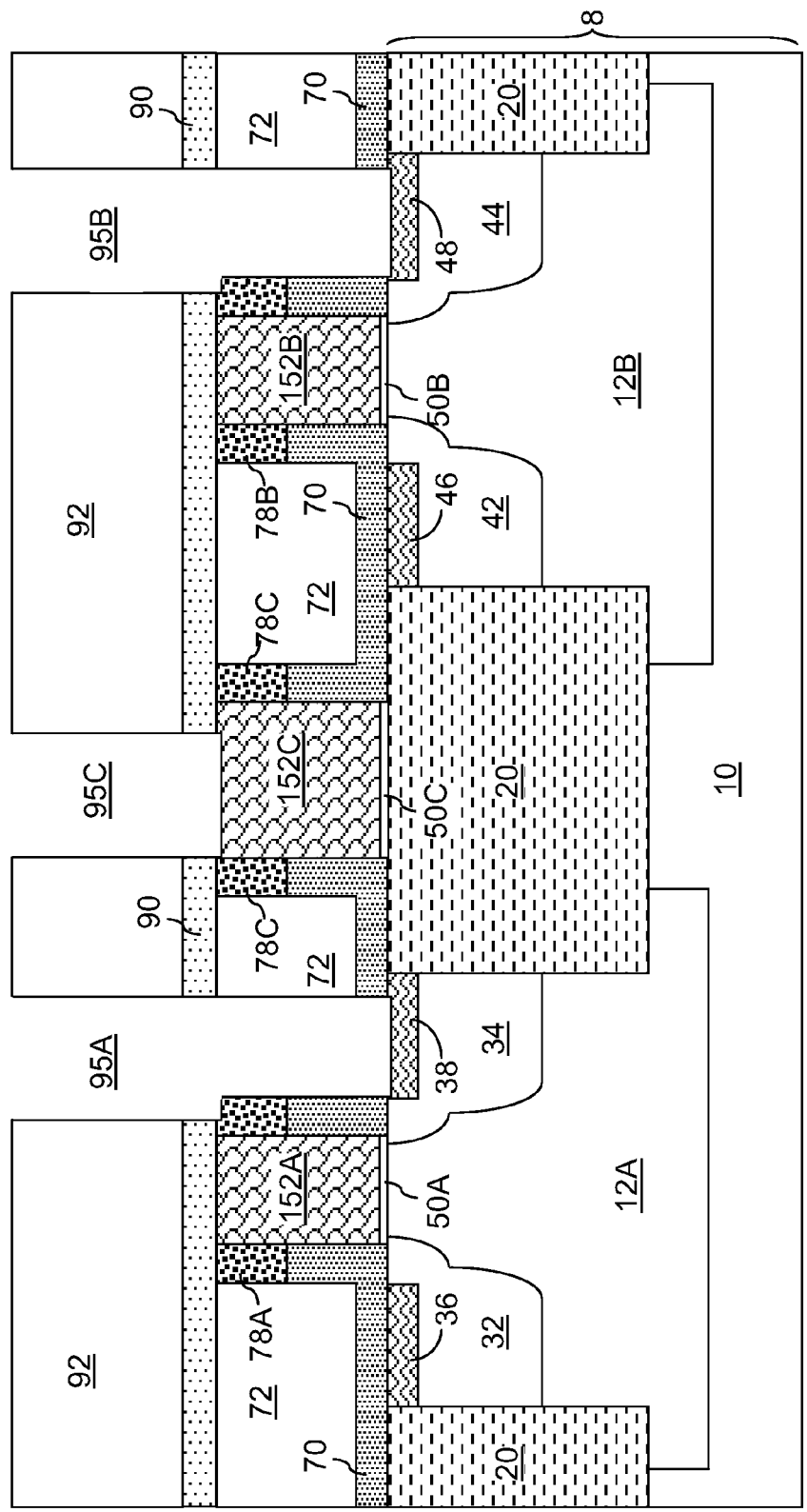

Referring to FIG. 24, the same processing steps as the processing steps of FIG. 14 of the first embodiment can be employed to deposit at least one upper contact-level dielectric material layer (90, 92) and to form self-aligned contact via holes (95A, 95B, 95C).

Figure 25:
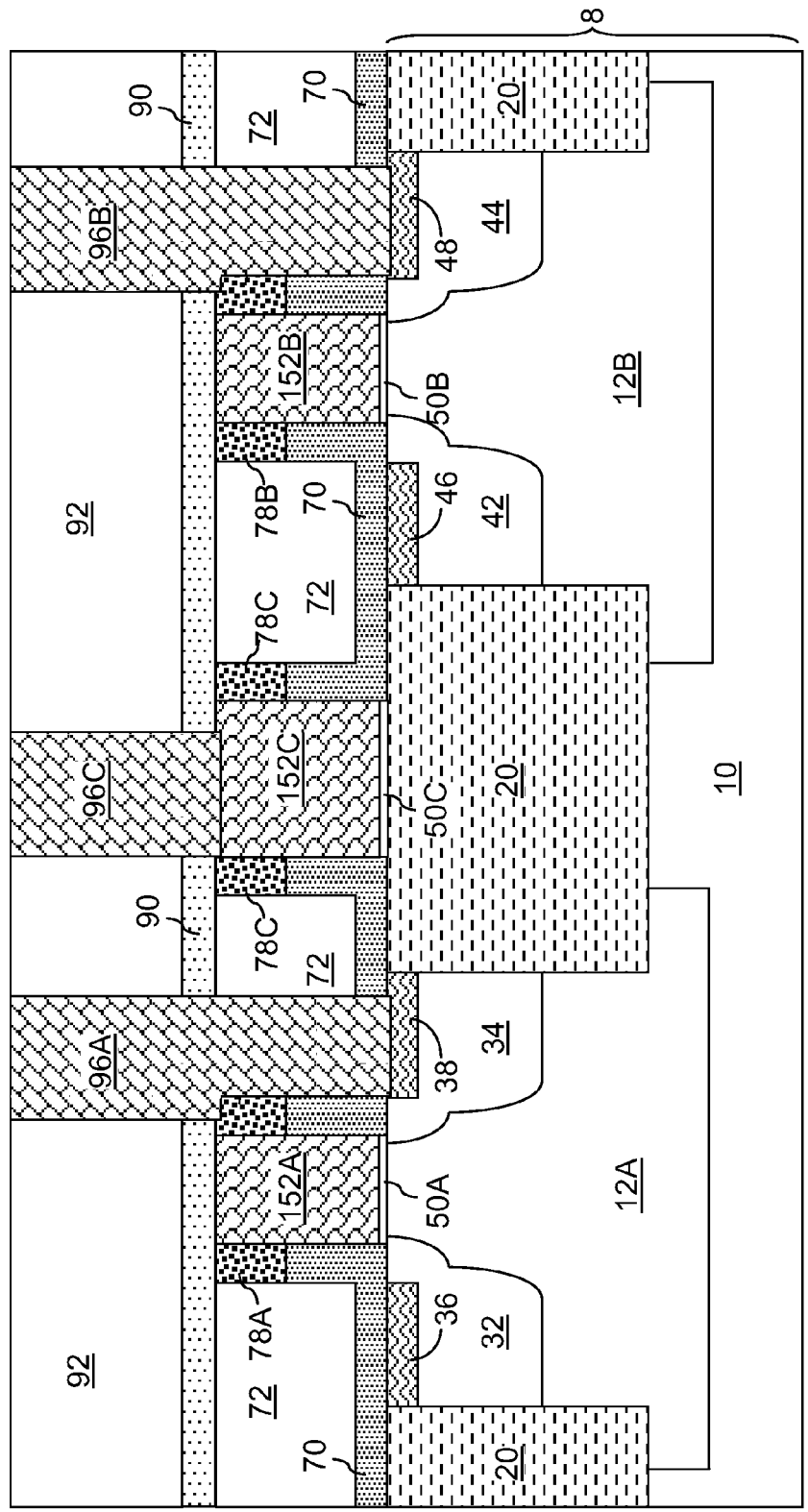

Referring to FIG. 25, the same processing steps as the processing steps of FIG. 15 of the first embodiment can be employed to form self-aligned contact structures (96A, 96B).

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
   a gate dielectric located on a semiconductor substrate;
   a gate electrode structure located on said gate dielectric;
   a dielectric metal oxide spacer contacting an upper portion of said gate electrode structure and not contacting a lower portion of said gate electrode structure;
   a dielectric liner having a top surface that contacts a bottom surface of said dielectric metal oxide spacer and contacting a top surface of said semiconductor substrate; and
   a dielectric material layer overlying a horizontal portion of said dielectric liner and having a top surface that is coplanar with a top surface of said dielectric metal oxide spacer.

2. The semiconductor structure of claim 1, wherein said dielectric liner comprises silicon nitride.

3. The semiconductor structure of claim 1, wherein a periphery of said top surface of said dielectric liner coincides with a periphery of a bottom surface of said dielectric metal oxide spacer.

4. The semiconductor structure of claim 1, further comprising a contact via structure extending through said dielectric material layer and contacting said dielectric metal oxide spacer and said semiconductor substrate.

5. The semiconductor structure of claim 4, wherein said contact via structure contacts a single sidewall of said dielectric metal oxide spacer and an upper surface of said dielectric metal oxide spacer that is vertically recessed from a topmost surface of said dielectric metal oxide spacer.

6. The semiconductor structure of claim 4, further comprising at least another dielectric material layer overlying said dielectric material layer, wherein said contact via structure extends through said at least another dielectric material layer.

7. The semiconductor structure of claim 4, wherein said contact via structure contacts a metal-semiconductor-alloy portion located in said semiconductor substrate.

8. The semiconductor structure of claim 1, wherein said dielectric metal oxide spacer comprises a material having a dielectric constant greater than 8.0.

9. The semiconductor structure of claim 8, wherein said dielectric metal oxide spacer comprises a material selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from 0.5 to 3 and each value of y is independently from 0 to 2.

10. The semiconductor structure of claim 1, wherein all inner sidewalls of said dielectric metal oxide spacer contact sidewalls of said gate electrode structure.

11. The semiconductor structure of claim 1, wherein said gate electrode structure includes a work-function-metal portion and a conductive metal portion.

12. The semiconductor structure of claim 1, wherein said gate electrode structure includes a doped semiconductor material.

* * * * *